(12) United States Patent
Zheng et al.

(10) Patent No.: US 10,643,725 B2
(45) Date of Patent: May 5, 2020

(54) MULTI-TIME PROGRAMMABLE DEVICE

(71) Applicant: GLOBALFOUNDRIES Singapore Pte. Ltd., Singapore (SG)

(72) Inventors: Ping Zheng, Singapore (SG); Eng Huat Toh, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 49 days.

(21) Appl. No.: 15/838,340

(22) Filed: Dec. 11, 2017

(65) Prior Publication Data

US 2018/0102178 A1 Apr. 12, 2018

Related U.S. Application Data

(62) Division of application No. 14/078,554, filed on Nov. 13, 2013, now abandoned.

(51) Int. Cl.
*G11C 17/14* (2006.01)
*H01L 27/112* (2006.01)
*H01L 45/00* (2006.01)

(52) U.S. Cl.
CPC ........ *G11C 17/14* (2013.01); *H01L 27/11206* (2013.01); *H01L 45/04* (2013.01); *H01L 45/1206* (2013.01); *H01L 45/146* (2013.01); *H01L 45/165* (2013.01); *H01L 45/1675* (2013.01)

(58) Field of Classification Search
None
See application file for complete search history.

(56) References Cited

U.S. PATENT DOCUMENTS

| | | |
|---|---|---|
| 2008/0101121 A1 | 5/2008 | Kreupl |
| 2009/0250726 A1 | 10/2009 | Kurjanowicz |
| 2011/0312169 A1 | 12/2011 | Kurjanowicz et al. |

(Continued)

OTHER PUBLICATIONS

M. Lanza, "A Review on Resistive Switching in High-k Dielectrics: A Nanoscale Point of View Using Conductive Atomic Force Microscope," Materials, 2014, pp. 2155-2159, 7.

(Continued)

*Primary Examiner* — Shaun M Campbell
*Assistant Examiner* — Aneta B Cieslewicz
(74) *Attorney, Agent, or Firm* — Thompson Hine LLP; Anthony Canale

(57) ABSTRACT

Devices and methods for forming a device are presented. The device includes a substrate having a device region and first and second isolation regions surrounding the device region. The device includes a multi-time programmable (MTP) memory cell having a single transistor disposed on the device region. The transistor includes a gate having a gate electrode over a gate dielectric which includes a programmable resistive layer. The gate dielectric is disposed over a channel region having first and second sub-regions in the substrate. The gate dielectric disposed above the first and second sub-regions has different characteristics such that when the memory cell is programmed, a portion of the programmable resistive layer above one of the first or second sub-region is more susceptible for programming relative to portion of the programmable resistive above the other first or second sub-region.

8 Claims, 26 Drawing Sheets

(56) References Cited

U.S. PATENT DOCUMENTS

| | | |
|---|---|---|
| 2012/0020138 A1 | 1/2012 | Lue et al. |
| 2014/0001568 A1 | 1/2014 | Wang et al. |
| 2014/0124864 A1* | 5/2014 | Hong ............... H01L 21/02532 |
| | | 257/355 |
| 2014/0138777 A1* | 5/2014 | Wang ..................... G11C 17/16 |
| | | 257/379 |
| 2016/0093398 A1 | 3/2016 | Choi et al. |

OTHER PUBLICATIONS

S. Jayanthi et al., "Investigation of Thermal Stability of High-k Interpoly Dielectrics in TaN Metal Floating Gate Memory Structures," 2011 3rd IEEE International Memory Workshop (IMW), 2011.

H.W. You et al., "Nonvolatile Poly-Si TFT Charge-Trap Flash Memory With Engineered Tunnel Barrier," IEEE Electra Device Letters, 2012, vol. 33, No. 2, pp. 170-172.

Jim Lipman, "Antifuse memory IP fuels low-power designs," EE Times, 2008.

Adnan Mehonic et al., "Resistive Switching in silicon suboxide films," Journal of Applied Physics, 2012, vol. 111, Issue 7 (074507).

Andrea Padovani et al. "Understanding the Role of the Ti Metal Electrode on the Forming of HfO2-based RRAMs," 2012 4th IEEE International Memory Workshop, 2012.

C. Cagli et al., "Experimental and theoretical study of electrode effects in HfO2based RRAM," 2011 International Electron Devices Meeting, 2011.

Haowei Zhang et al., "Gd-doping effect on performance of HfO2 based resistive switching memory devices using implantation approach," Applied Physics Letters, 2011, vol. 98, Issue 4 (042105).

* cited by examiner

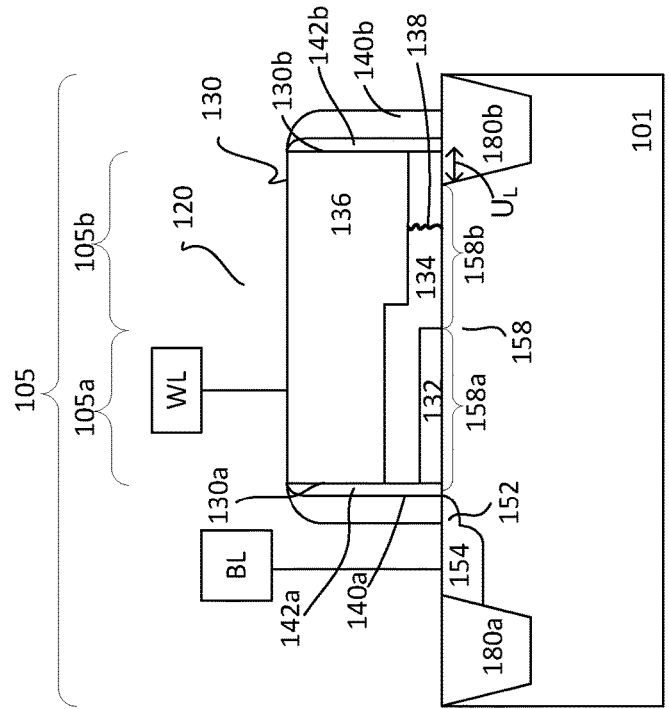
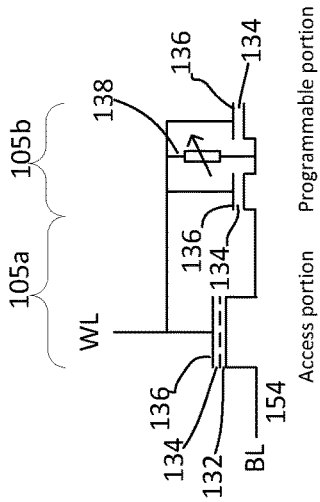
Fig. 1a₁
Fig. 1b₁
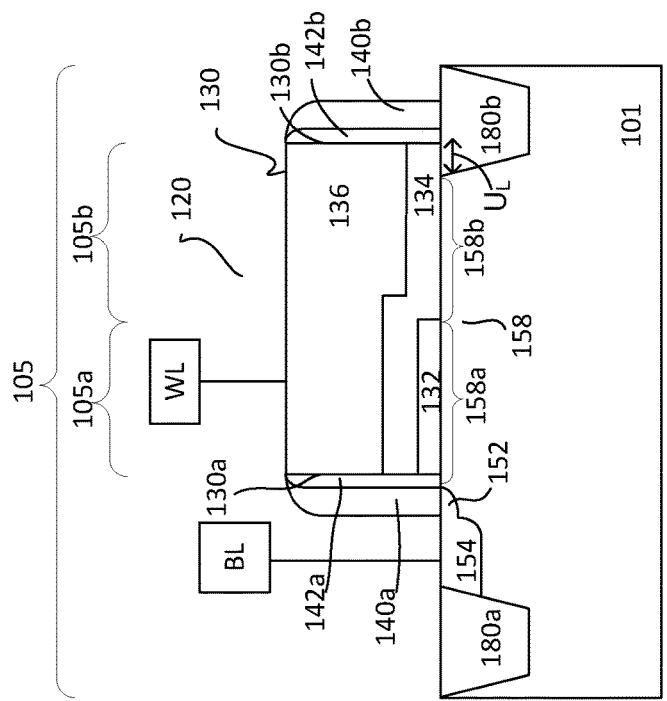
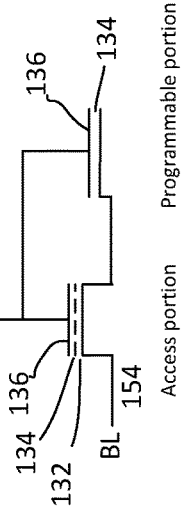
Fig. 1a₂
Fig. 1b₂

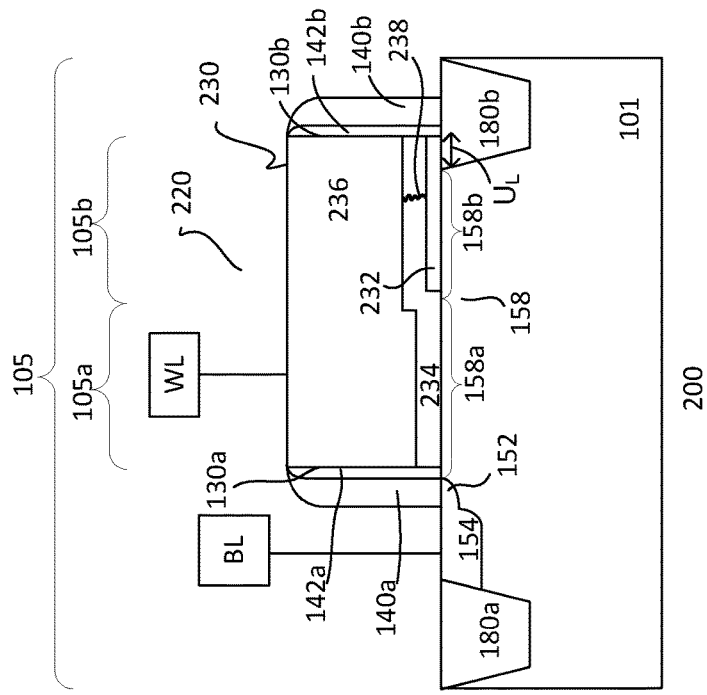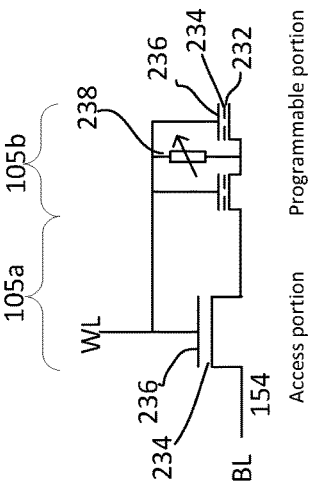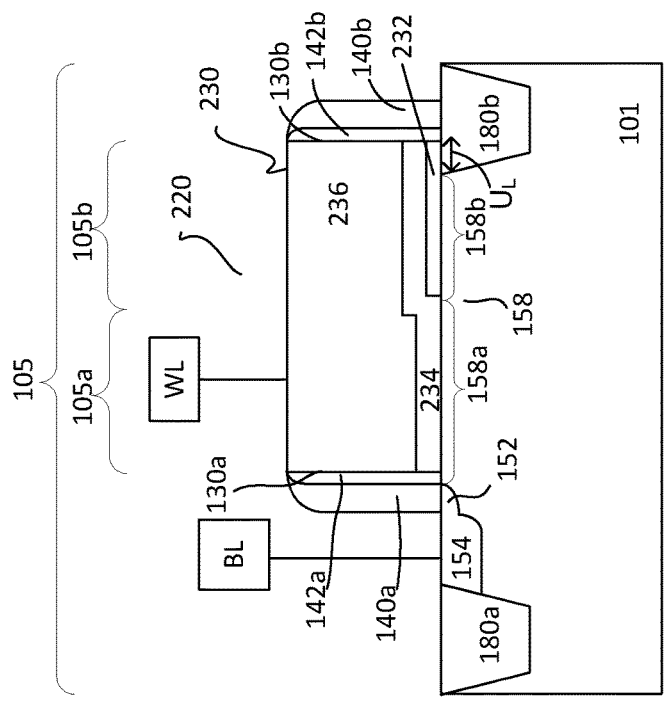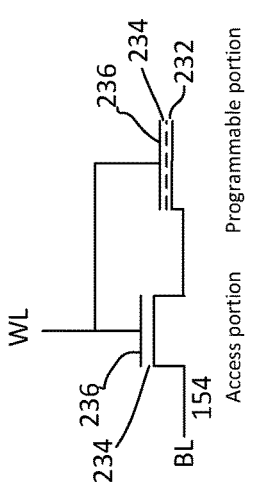

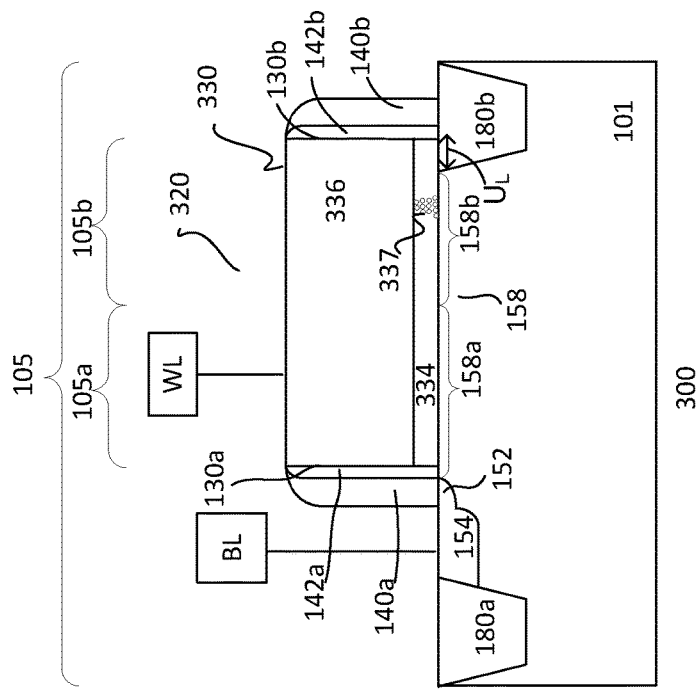
Fig. 3a₁
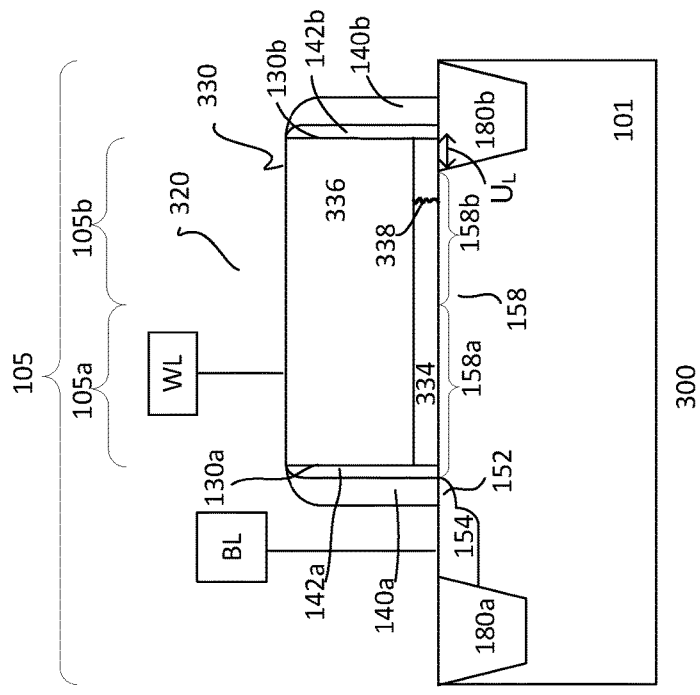
Fig. 3a₂
Fig. 3b₁
Fig. 3b₂

MULTI-TIME PROGRAMMABLE DEVICE

CROSS-REFERENCE TO RELATED APPLICATION

This application is a divisional application claiming the benefit of co-pending U.S. patent application Ser. No. 14/078,554, filed on Nov. 13, 2013, which is incorporated herein by reference in its entirety for all purposes.

FIELD OF THE INVENTION

The present invention relates generally to non-volatile memory. More particularly, the present invention relates to multi-time programmable non-volatile memory devices.

BACKGROUND

Floating gate and charge trapping based multi-time programmable (MTP) non-volatile memory (NVM) devices have achieved widespread adoptions in analog and mixed signal ICs due to their CMOS compatibility and low cost. However, current embedded MTP suffers from scaling issue, endurance/retention limit, high power consumption, complex structure, additional processing steps and high cost.

Therefore, it is desirable to provide an area efficient, low power, high speed and highly reliable MTP memory. Furthermore, it is also desirable to provide simplified methods to produce such MTP memory which is compatible with CMOS processing and with reduced manufacturing cost.

SUMMARY

Embodiments generally relate to semiconductor devices and methods of forming a device. In one embodiment, a device is presented. The device includes a substrate having a device region and first and second isolation regions surrounding the device region. The device includes a multi-time programmable (MTP) memory cell having a single transistor disposed on the device region. The transistor includes a gate having a gate electrode over a gate dielectric which includes a programmable resistive layer. The gate dielectric is disposed over a channel region having first and second sub-regions in the substrate. The gate dielectric disposed above the first and second sub-regions has different characteristics such that when the memory cell is programmed, a portion of the programmable resistive layer above one of the first or second sub-region is more susceptible for programming relative to portion of the programmable resistive above the other first or second sub-region.

In another embodiment, a method of forming a device is disclosed. The method includes providing a substrate having a device region prepared with first and second isolation regions surrounding the device region. A gate having first and second sidewalls disposed over a channel region in the substrate is formed. The channel region includes first and second sub-regions. The gate includes a gate electrode and gate dielectric having a programmable resistive layer disposed between the gate electrode and substrate, and the gate partially overlaps the second isolation region adjacent to the second sidewall of the gate. A heavily doped region of a first polarity type is formed in the substrate in between the first isolation region and the first sidewall of the gate. The gate dielectric above the first and second sub-regions has different characteristics such that when the memory cell is programmed, a portion of the programmable resistive layer above one of the first or second sub-region is more susceptible for programming relative to portion of the programmable resistive layer above the other first or second sub-region.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. $1a_1$ and $1b_1$ show cross-sectional view and circuit diagram of an embodiment of a device in a high resistive state and FIGS. $1a_2$ and $1b_2$ show cross-sectional view and circuit diagram of the device in a low resistive state;

Figure 4:
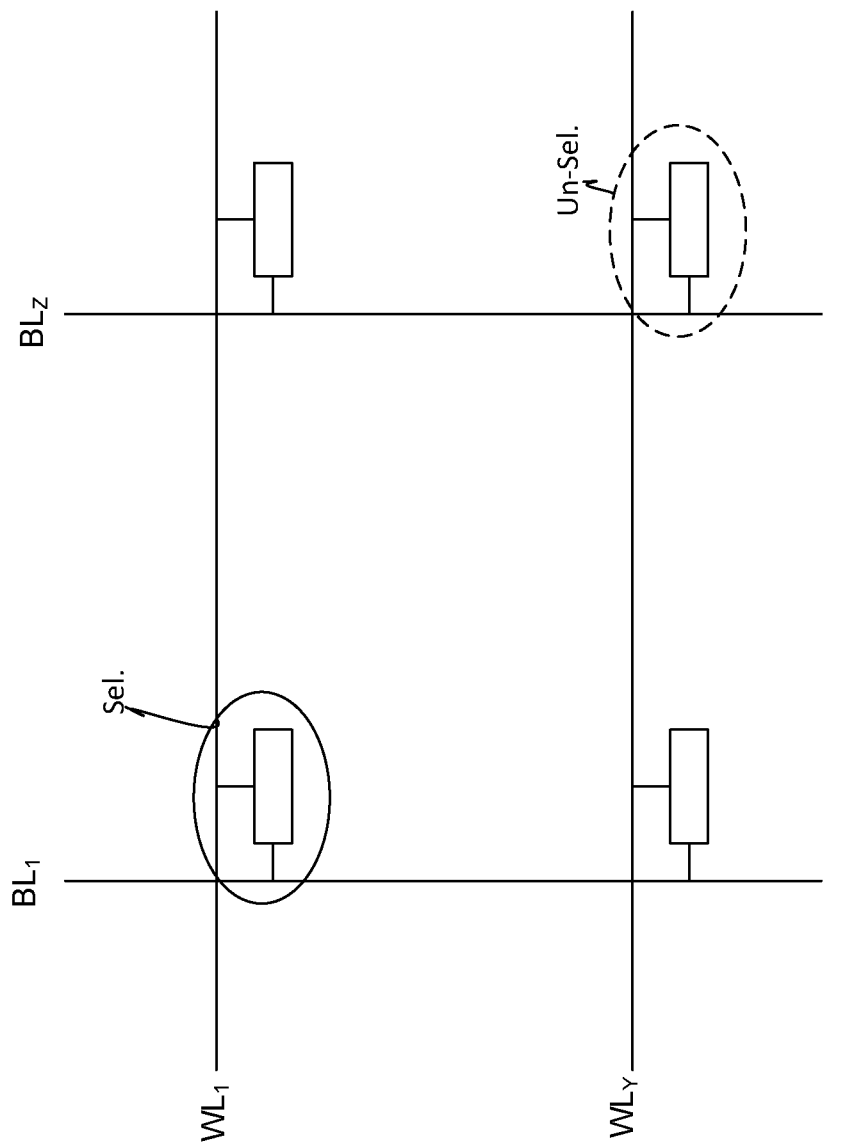

FIGS. $2a_1$ and $2b_1$ show cross-sectional view and circuit diagram of another embodiment of a device in a high resistive state and FIGS. $2a_2$ and $2b_2$ show cross-sectional view and circuit diagram of the device in a low resistive state;

FIGS. $3a_1$ and $3b_1$ show cross-sectional view and circuit diagram of another embodiment of a device in a high resistive state and FIGS. $3a_2$ and $3b_2$ show cross-sectional view and circuit diagram of the device in a low resistive state;

FIG. 4 shows an embodiment of a memory array; and

FIGS. 5a-5h, FIGS. 6a-6h, FIGS. 7a-7f, FIGS. 8a-8j, FIGS. 9a-9f and FIGS. 10a-10f show various embodiments of a process for forming a memory cell.

DETAILED DESCRIPTION

Embodiments generally relate to semiconductor devices. Some embodiments relate to memory devices. More particularly, some embodiments relate to a transistor device that can be employed in a non-volatile, MTP memory array application. The devices or integrated circuits (ICs) can be incorporated into or used with, for example, consumer electronic products, such as but not limited to personal computers, tablets, smartphones, and other system-on-chip (SoC) designs. The embodiments generally relate to a single transistor having a gate with a gate dielectric which includes a programmable resistive layer. The gate dielectric is disposed over a channel region which can be separated into first and second sub-regions. The gate dielectric above the first and second sub-regions has different characteristics. For example, during programming operation, the gate dielectric above the first sub-region will remain unchanged while the gate dielectric above the second sub-region will be programmed. Thus, the first sub-region may serve as an access region while the second sub-region may serve as a programmable region of the cell. Details of modifying the gate dielectric to achieve the different characteristics such that portion of the gate dielectric above one of the sub-regions is more susceptible or conducive for programming operation relative to portion of the gate dielectric above the other sub-region will be described in detail below.

FIGS. 1a-1b illustrate cross-sectional view and circuit diagram of an embodiment of a device 100. Figures with a subscript 1 show the device in a first or high resistive state while figures with a subscript 2 correspond to the device in a second or low resistive state.

A substrate 101 is shown which includes a device region. The device region, in one embodiment, is a cell region 105, in which a memory cell is disposed. The cell region, in one embodiment, includes a first sub-region 105a and a second sub-region 105b. The memory cell, in one embodiment, includes a NVM cell. In one embodiment, the NVM cell is a MTP memory cell.

The substrate 101, for example, includes a silicon substrate. The substrate, for example, can be a lightly doped substrate. The substrate may be lightly doped with p-type dopants. Providing other types of substrates may also be useful. For example, the substrate may be doped with n-type dopants and/or other dopant concentrations, including intrinsically doped substrates. In other embodiments, the substrate may be a semiconductor-on-insulator substrate, such as silicon-on-insulator (SOI) or germanium-on-insulator substrates. A semiconductor-on-insulator substrate includes a surface and bulk semiconductor layers separated by an insulator, such as silicon oxide. The semiconductor layers may be doped or undoped. Additionally, it is understood that the different semiconductor layers (e.g., surface and bulk) need not be of the same type of semiconductor materials.

Isolation regions 180a-180b are provided for isolating the cell region from, for example, other device regions (not shown), such as but not limited to input/output (I/O) device region and core region, of the substrate. The isolation regions may isolate other cell regions of an array region as well as other device regions. In one embodiment, the isolation regions are a shallow trench isolation (STI) region. A STI, for example, includes an isolation or dielectric material, such as silicon oxide, in a trench which surrounds the device region. The STI may have a depth and width sufficient to provide isolation from one device region to another. For example, the STI may have a depth of about 300 nm and a width of about 60 nm. Other dielectric materials or dimensions may also be useful for the STI. Alternatively, other types of isolation regions may also be employed. For example, the isolation region may be a deep trench isolation (DTI) region which is deeper than a STI.

In one embodiment, the MTP memory cell includes a single transistor 120 having a gate structure 130. The gate structure, in one embodiment, includes a dielectric layer 132 and a gate electrode 136 over a programmable resistive layer 134. In one embodiment, the dielectric layer 132 is disposed over the first sub-region 105a of the cell region while the gate electrode 136 and the programmable resistive layer 134 are disposed over the first and second sub-regions. In one embodiment, a first portion of the programmable resistive layer is disposed in between the gate electrode and the dielectric layer 132 in the first sub-region and a second portion of the programmable resistive layer is disposed directly over the substrate and below the gate electrode in the second sub-region.

The dielectric layer 132, for example, is the same dielectric layer used for forming the gate dielectric of other devices, including but not limited to the I/O devices (not shown) of CMOS process disposed on the same substrate. The dielectric layer 132, for example, includes a high k dielectric material. In one embodiment, the dielectric layer includes $SiO_2$, $HfO_x$, $Al_2O_3$, $TaO_x$, etc. Other suitable types of dielectric material may also be useful. The length of the dielectric layer 132, for example, may be shorter than the length of the gate dielectric of the I/O device. The thickness and length of the dielectric layer 132, for example, may be about 50 Å and 20 nm respectively. Other suitable thicknesses and lengths may also be useful.

Depending on the CMOS process, the programmable resistive layer 134, for example, may be the same dielectric layer used for forming the gate dielectric of other devices, including but not limited to the core devices (not shown) disposed on the same substrate. The programmable resistive layer 134, for example, includes a programmable resistive material that creates conduction paths or filaments when subjected to a forming procedure. Generally, the forming procedure is performed on a new device that has not yet been operated. During programming operation, the filaments can be reset or broken by subjecting the programmable resistive material to a reset procedure or condition; the filaments can be set or re-formed by subjecting the programmable resistive material to a set procedure or condition as will be described later. Once set or reset, the state of the resistor is stable until reset or set.

The programmable resistive layer, in one embodiment, includes a transitional metal oxide, such as but not limited to nickel oxide ($NiO_2$), hafnium oxide ($HfO_2$), zirconium oxide ($ZrO_2$), aluminum oxide ($AlO_2$), titanium oxide ($TiO_2$), tantalum oxide ($Ta_2O_5$), tungsten oxide (WOx), titanium oxynitride (TiON), germanium oxide (GeO), silicon oxide ($SiO_2$) or tin oxide ($SnO_2$). Other types of programmable resistive materials may also be useful. The thickness and length of the programmable resistive layer 134, for example, may be about 50 Å and 18 nm respectively. Other suitable thicknesses and lengths may also be useful.

The gate electrode 136, as shown, is disposed over the programmable resistive layer 134. The gate electrode may serve as a top electrode of the memory cell. The gate electrode is coupled to a wordline (WL) through a WL contact (not shown). The gate electrode, for example, is the same gate electrode used for forming the gate electrode of other devices, such as but not limited to I/O and core devices, disposed on the same substrate. The gate electrode, for example, includes polysilicon or metal, depending on the CMOS process. Various suitable types of metal, such as Ru, W, Pt, TiN, Ti, Zr, TaN, Si or Al, can be used. Other suitable types of gate electrode materials, such as metal or metal nitride, are also useful. The thickness of the gate electrode 136 may be about 60 nm. Other suitable thicknesses may also be useful.

First and second sidewalls 130a-130b of the gate can be provided with first type sidewall spacers 142a-142b. The first type sidewall spacer 142a adjacent to the first gate sidewall 130a, for example, facilitates displacing a lightly doped region 152 from the first gate sidewall 130a. Second type sidewall spacers 140a-140b are disposed adjacent to the first type sidewall spacers 142a-142b. The second type sidewall spacer 140a adjacent to the first type sidewall spacer 142a, for example, facilitates displacing a doped region 154 from the first gate sidewall 130a. The sidewall spacers are formed of a dielectric material, such as silicon oxide. Other types of dielectric materials, such as silicon nitride, or a combination of dielectric materials may also be useful. The thickness of the first type spacers 142a-142b, for example, may be about 80 Å while the thickness of the second type spacers 140a-140b, for example, may be about 150 Å. Other suitable thicknesses may also be useful.

A doped or diffusion region 154 is disposed in the substrate adjacent to the first sidewall 130a of the gate. The doped region 154 is disposed in the device region in between the first isolation region 180a and the second type sidewall spacer 140a. The doped region 154 serves as a source region of the memory cell. The doped region 154 is coupled to a bit line (BL) through a bit line contact (not shown). The doped region 154 includes first polarity type dopants. In one embodiment, the doped region 154 is heavily doped with first polarity type dopants. The concentration of the doped region may be about $10^{18}$-$3\times10^{20}$ cm$^{-3}$. Other dopant concentrations may be useful. The first polarity type dopant, in one embodiment, is n-type. Providing first polarity type dopants which are p-type may also be useful. The depth of the doped region, for example, may be about 80 nm. Providing other depths for the doped region may also be useful. N-type dopants can include phosphorus (P), arsenic (As), antimony (Sb) or a combination thereof while p-type dopants can include boron (B), indium (In) or a combination thereof.

The transistor may include a lightly doped region 152. The lightly doped region 152 extends from the source region to under the second type spacer 140a. The lightly doped region, in one embodiment, is lightly doped with first polarity type dopants. The lightly doped region, for example, has a dopant concentration of about $10^{17}$-$10^{20}$ cm$^{-3}$. Other dopant concentrations for the doped region may also be useful. The depth of the lightly doped region is shallower than the source region. For example, the depth of the lightly doped region may be about 20 nm. Providing the lightly doped region having other depths may also be useful.

The surface of the gate electrode and the doped region 154 may be provided with metal silicide contacts (not shown). The metal silicide contacts, for example, may be nickel based metal silicide contacts. Other types of metal silicide contacts may also be useful. The metal silicide contacts facilitate reduced contact resistance.

Referring to FIGS. $1a_1$-$1a_2$, the substrate area between the source region and the isolation region 180b adjacent to the second side 130b of the gate and partially underlaps the gate corresponds to a channel region 158 of the transistor. The underlapping region UL, for example, includes a length of about 5 nm. Other suitable dimensions may also be useful. The channel region 158, in one embodiment, includes a first sub-region 158a and a second sub-region 158b. In one embodiment, the dielectric layer 132 and the first portion of the programmable resistive layer are disposed over the first sub-region 158a of the channel region which is disposed adjacent to the source region while the second portion of the programmable resistive layer is disposed over the second sub-region 158b of the channel region which is disposed adjacent to the isolation region 180b which partially underlaps the gate.

The dielectric layer 132 and first portion of the programmable resistive layer 134 thereover correspond to the gate dielectric over the first channel sub-region 158a while the second portion of the programmable resistive layer adjacent to the second isolation region 180b corresponds to the gate dielectric over the second channel sub-region 158b. The dielectric layer 132 includes a different material than the programmable resistive layer 134. Since the second portion of the programmable resistive layer is directly disposed and contacts the second channel sub-region 158b, a lower form or set voltage ($V_{form}$ or $V_{set}$) is required for forming the filaments or conduction paths therein relative to the first portion of the programmable resistive layer which is disposed on the dielectric layer over the first sub-region 158a. The second portion of the programmable resistive layer over the second channel sub-region 158b is more susceptible or conducive for forming the filaments or conduction paths 138 as shown in FIG. $1a_2$. The second portion of the programmable resistive layer which is adjacent to the isolation region 180b corresponds to a programmable portion where programming, such as form, set or reset procedures, can occur. Furthermore, there is no drain region disposed within the substrate as shown in FIGS. $1a_1$-$1a_2$. The first portion of the programmable resistive layer which is adjacent to the source region 154 thus corresponds to an access portion where current between the gate which is coupled to the WL and doped region 154 which is coupled to BL is to flow when accessing the memory cell.

To access and program the memory cell, appropriate voltages should be applied to the WL and BL respectively. The programmable portion of the programmable resistive layer can be put in a first or a second state, depending on the voltage which is applied to the WL. The programmable portion remains in a stable state until switched to the other state. In one embodiment, the programmable resistive layer is formed from a material which, when conductions paths or filaments 138 are formed, can be broken (reset) or reformed (set) to be in a high or low resistive state. In one embodiment, when the conduction paths are broken or reset during a reset procedure, the programmable portion is in the first or high resistive state which corresponds to a logic "0" stored as shown in FIGS. $1a_1$-$1b_1$; when the conduction paths 138 are formed or reformed (set) in the programmable portion, it is in the second or low resistive state which corresponds to a logic "1" stored as shown in FIGS. $1a_2$-$1b_2$. Other configurations of resistive states and data stored in the programmable resistive layer may also be useful.

The embodiment as described in FIGS. 1a-1b includes an access portion and an embedded programmable portion in a single transistor. Thus, the memory cell as described significantly reduces area requirements. The use of a programmable resistive layer enables multi-time programmability. Providing a second isolation region 180b which partially underlaps the gate as described also reduces the length of the second channel sub-region 158b. A shorter channel length limits a low number of filaments to be formed in the programmable portion of the programmable resistive layer and improves reproducibility of the filaments at almost the same location. Thus, the arrangement of the second isolation region 180b provides scaling effect to improve the memory program variation. Compared to conventional floating gate or charge trapping type of MTP, the embodiment as described in FIGS. 1a-1b which works as resistive memory with filaments formation requires lower operating voltage, leading to significant power reduction. Furthermore, without a drain region, the access portion of the memory cell adjacent to the source region is confined in the first channel sub-region, ensuring that the current only flows from BL to WL.

FIGS. 2a-2b show cross-sectional view and circuit diagram of another embodiment of a device 200. Figures with a subscript 1 show the device in a high resistive state while figures with a subscript 2 correspond to the device in a low resistive state. The device is similar to the device as described in FIGS. 1a-1b. For example, the device includes a MTP memory cell which includes a single transistor 220 having a gate structure 230. Isolation regions 180a-180b are provided for isolating the cell region from, for example, other device regions. As such, common elements may not be described or described in detail.

In one embodiment, the gate structure 230 as shown in FIGS. 2a-2b differs from the gate structure 130 in that the gate structure 230 includes a buffer layer 232 instead of a dielectric layer 132. In one embodiment, the buffer layer is disposed in the memory cell region on top of the substrate. The buffer layer includes a material which can be selectively removed with respect to the substrate. In one embodiment, the buffer layer includes titanium (Ti). Other suitable types of materials which may assist in changing the characteristic of the programmable resistive layer thereover such that filaments or conduction paths are easily formed or lowering the $V_{form}$ or $V_{set}$ of the programmable resistive layer may also be useful. The thickness and length of the buffer layer 232 may be about 5 nm and 10 nm, respectively. Other suitable thicknesses and lengths may also be useful for the buffer layer.

In one embodiment, the buffer layer 232 is disposed over the second channel sub-region 158b while a gate electrode 236 and a programmable resistive layer 234 are disposed over the first and second channel sub-regions 158a-158b. In one embodiment, a first portion of the programmable resistive layer is disposed directly over the substrate and below the gate electrode in the first sub-region 158a while a second portion of the programmable resistive layer is disposed in between the gate electrode and the buffer layer 232 in the second sub-region 158b.

The gate electrode 236 and programmable resistive layer 234 may include the same material as the gate electrode 136 and programmable resistive layer 134 described with respect to FIGS. 1a-1b above. Moreover, the memory cell also includes doped region 154, lightly doped region 152, sidewall spacers 140a-140b and 142a-142b, silicide contacts (not shown), such as those already described in FIGS. 1a-1b.

As described, the second portion of the programmable resistive layer 234 is disposed over the buffer layer 232 which assists in lowering the $V_{form}$ and $V_{set}$. Thus, the second portion of the programmable resistive layer over the second channel sub-region 158b is more susceptible or conducive for forming the filaments or conduction paths 238 relative to the first portion of the programmable resistive layer as shown in FIG. $2a_2$. The buffer layer 232 and second portion of the programmable resistive layer thereover adjacent to the second isolation region 180b correspond to the gate dielectric over the second channel sub-region 158b while the first portion of the programmable resistive layer adjacent to the source region 154 corresponds to the gate dielectric over the first channel sub-region 158a. The second portion of the programmable resistive layer which is adjacent to the isolation region 180b corresponds to a programmable portion where programming, such as form, set or reset procedures, can occur. Furthermore, there is no drain region disposed within the substrate as shown in FIGS. $2a_1$-$2a_2$. The first portion of the programmable resistive layer 234 which is adjacent to the source region 154 thus corresponds to an access portion where current between the gate which is coupled to the WL and doped region 154 which is coupled to BL is to flow when accessing the memory cell.

The memory cell of FIGS. 2a-2b operates in the same manner as that described in FIGS. 1a-1b. For example, when the conduction paths 238 are broken or reset during a reset procedure, the programmable portion is in the high resistive state which corresponds to a logic "0" stored as shown in FIGS. $2a_1$-$2b_1$; when the conduction paths 238 are formed or reformed (set) in the programmable portion, it is in the low resistive state which corresponds to a logic "1" stored as shown in FIGS. $2a_2$-$2b_2$. As such, common elements and the operation of the memory cell will not be described or described in detail.

FIGS. 3a-3b show cross-sectional view and circuit diagram of another embodiment of a device 300. Figures with a subscript 1 show the device in a high resistive state while figures with a subscript 2 correspond to the device in a low resistive state. The device is similar to the device as described in FIGS. 1a-1b and FIGS. 2a-2b. For example, the device includes a MTP memory cell which includes a single transistor 320 having a gate structure 330. Isolation regions 180a-180b are provided for isolating the cell region from, for example, other device regions. As such, common elements may not be described or described in detail.

Referring to FIGS. 3a-3b, the gate structure 330 differs from the gate structures 130 and 230 of FIGS. 1a-1b and FIGS. 2a-2b. As shown, the gate structure 330 is devoid of dielectric or buffer layer. In one embodiment, a programmable resistive layer 334 is disposed directly over the first and second channel sub-regions 158a-158b. In one embodiment, the programmable resistive layer 334 is disposed directly over the substrate and below a gate electrode 336 in the first and second sub-regions 158a-158b. The thickness and length of the programmable resistive layer may be about 5 nm and 20 nm, respectively. Other suitable thicknesses and lengths may also be useful for the programmable resistive layer so long as it is about the same as the designed gate length or depending on the core device process design rule. In one embodiment, a portion of the programmable resistive layer 334 over the second sub-region 158b includes metallic dopants 337. The metallic dopants, for example, include Gd, Al, etc. Other suitable types of dopants which may assist in changing the characteristic of the programmable resistive layer such that filaments or conduction paths are easily formed or lowering the $V_{form}$ or $V_{set}$ of the programmable resistive layer may also be useful.

The gate electrode 336 and programmable resistive layer 334 may include the same material as the gate electrode 136 and programmable resistive layer 134 described with respect to FIGS. 1a-1b above. Moreover, the memory cell also includes doped region 154, lightly doped region 152, sidewall spacers 140a-140b and 142a-142b, silicide contacts (not shown), such as those already described in FIGS. 1a-1b.

As described, the second portion of the programmable resistive layer 334 disposed over the second sub-region 158b includes metallic dopants 337 which assist in lowering the $V_{form}$ and $V_{set}$. Thus, the second portion of the programmable resistive layer over the second channel sub-region 158b is more susceptible or conducive of forming the filaments or conduction paths 338 relative to the first portion of the programmable resistive layer as shown in FIG. $3a_2$. The second portion of the programmable resistive layer having dopants which is adjacent to the second isolation region 180b correspond to the gate dielectric over the second channel sub-region 158b while the first portion of the programmable resistive layer devoid of metallic dopants which is adjacent to the source region 154 corresponds to the gate dielectric over the first channel sub-region 158a. The second portion of the programmable resistive layer having dopants which is adjacent to the isolation region 180b corresponds to a programmable portion where programming, such as form, set or reset procedures, can occur. Furthermore, there is no drain region disposed within the substrate as shown in FIGS. $3a_1$-$3a_2$. The undoped first portion of the programmable resistive layer 334 which is adjacent to the source region 154 thus corresponds to an access portion where current between the gate which is coupled to the WL and doped region 154 which is coupled to BL is to flow when accessing the memory cell.

The memory cell of FIGS. 3a-3b operates in the same manner as that described in FIGS. 1a-1b. For example, when the conduction paths are broken or reset during a reset procedure, the programmable portion is in the high resistive state which corresponds to a logic "0" stored as shown in FIGS. $3a_1$-$3b_1$; when the conduction paths 338 are formed or reformed (set) in the programmable portion, it is in the low resistive state which corresponds to a logic "1" stored as shown in FIGS. $3a_2$-$3b_2$. As such, common elements and the operation of the memory cell will not be described or described in detail.

The embodiments described with respect to FIGS. 2a-2b and FIGS. 3a-3b include some or all advantages as described with respect to FIGS. 1a-1b. As such, these advantages will not be described or described in detail. Moreover, if the programmable resistive layer includes the same material for the embodiments of FIGS. 1a-1b, 2a-2b and 3a-3b, the embodiments of FIGS. 2a-2b and 3a-3b are further advantageous over the embodiment of FIGS. 1a-1b due to the presence of filaments or conduction paths inducement elements, such as the buffer layer and the metallic dopants. The presence of the filaments inducement elements as shown in the embodiments of FIGS. 2a-2b and 3a-3b requires lower $V_{form}$ or $V_{set}$ relative to the embodiment shown in FIGS. 1a-1b. Thus, the operating voltage of these embodiments is lower than that of the embodiment of FIGS. 1a-1b.

A plurality of the MTP cells as described of any of the embodiments above may be interconnected by wordlines and bitlines to form a memory array 400. As described, the memory cell includes a wordline terminal and a bitline terminal. The wordline terminal is coupled to a wordline WL and the bitline terminal is coupled to a bitline BL. FIG. 4 shows an embodiment of a memory array 400 being a y z array, with wordlines $WL_1$-$WL_y$ and bitlines $BL_1$-$BL_z$. Wordlines may correspond to rows of memory cells of the array while bitlines may correspond to columns of the array.

A bit may be selected for accessing by providing the appropriate voltages to wordlines and bitlines of the memory array. When a bit is selected, its respective transistor is in a low resistance state, allowing current to flow through the selected bit. In contrast, the transistor of an unselected bit is floating. This prevents current from flowing through an unselected bit. The memory cells, for example, may be configured as NOR cells, depending on design and operation requirements. Other configurations of arrays and/or accessing cells in the array may also be useful.

A bit access may include different types of memory operations of a MTP memory cell. For example, a bit access may include forming, read, set and reset operations. Table 1a shows the various signals applied to the terminals of the memory cell, depending on the desired operation and bit to access.

TABLE 1a

| Operation | BL Sel. | BL Un-sel. | WL Sel. | WL Un-sel. |
|---|---|---|---|---|
| Forming | $V_{form, Sel}$ | Float | $V_{form, High}$ | Float |
| Read | $V_{read, Sel}$ | Float | $V_{read, High}$ | Float |
| Set | $V_{set, Sel}$ | Float | $V_{set, High}$ | Float |
| Reset | $V_{reset, Sel}$ | Float | $V_{reset, High}$ | Float |

Table 1b shows an embodiment of the values for the different signals applied to the terminals of the memory cell 120. Other suitable voltage values may also be useful.

TABLE 1b

| Signal | $V_{form}$ | $V_{read}$ | $V_{set}$ | $V_{reset}$ |
|---|---|---|---|---|
| BL | GND | 0.05 V | GND | GND |
| WL | 3 V | GND | 2 V | −2 V |
| BULK | GND | GND | GND | GND |

Table 1c shows an embodiment of the values for the different signals applied to the terminals of the memory cell 220 or 320. Other suitable voltage values may also be useful.

TABLE 1c

| Signal | $V_{form}$ | $V_{read}$ | $V_{set}$ | $V_{reset}$ |
|---|---|---|---|---|
| BL | GND | 0.05 V | GND | GND |
| WL | 2 V | GND | 1 V | −1 V |
| BULK | GND | GND | GND | GND |

Figure 5A:
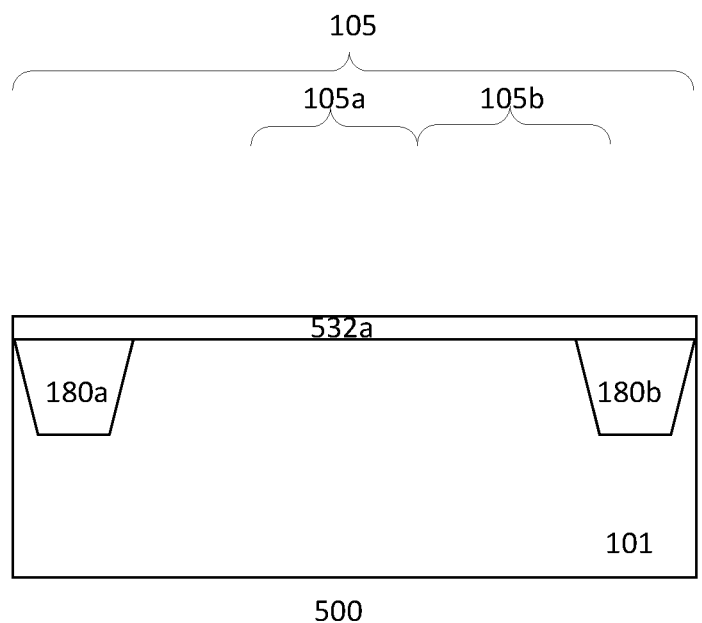

FIGS. 5a-5h show an embodiment of a process for forming a portion of a device or IC 500. The process is illustrated by cross-section views of the device along a channel length direction. Referring to FIG. 5a, a substrate 101 is provided. The substrate, for example, may be a silicon substrate. The substrate can be lightly doped with p-type dopants. Other types of semiconductor substrate, such as substrate doped with other types of dopants or concentrations (including intrinsic or undoped), may also be used. The substrate, for example, may be a silicon-germanium, germanium, gallium-arsenide, or crystal-on-insulator (COI) such as silicon-on-insulator (SOI).

The substrate is prepared with a device region. The device region, in one embodiment, serves as a cell region 105 for a memory cell. The cell region, in one embodiment, includes a first sub-region 105a and a second sub-region 105b. The substrate is prepared with isolation regions 180a-180b. The isolation regions serve to isolate the cell region from other device regions (not shown). In one embodiment, the isolation region includes a shallow trench isolation (STI) region. The STI region, for example, may have a depth of about 300 nm and a width of about 60 nm. Other dimensions for the STI region as well as other types of isolation regions may also be useful. Various processes can be employed to form the STI region. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STI.

As shown, the substrate includes one device region. It is, however, understood that the substrate may include a plurality of device regions (not shown), including but not limited to I/O and core devices, in the same substrate. Numerous cell regions may also be provided in an array region to form a plurality of memory cells. In some cases, one memory cell may occupy one cell region. For example, an isolation region may surround a cell region. Other configurations of memory cells, device regions, and isolation regions may also be useful.

A deep well (not shown) may be formed in the substrate. In one embodiment, the deep well is formed by implantation. The deep well includes second polarity type dopants for a first polarity type device. The deep well serves as a device well of the memory cell. The deep well, for example, has a depth which is shallower than the STI region. In some cases, a deep well extends below a bottom of the STI region may also be useful. In some embodiments, no deep well is provided. In such cases, the starting substrate may already be appropriately doped to serve as a deep well.

Referring to FIG. 5a, a dielectric layer 532a is formed on the substrate. In one embodiment, the dielectric layer 532a, for example, includes the same material used for forming gate dielectric of other devices, including the I/O devices (not shown). The dielectric layer, in one embodiment, includes silicon oxide. Other suitable types of dielectric material may also be useful, for example, depending on the material used for forming gate dielectric of the I/O device. The dielectric layer, for example, may include oxide formed by high temperature oxidation process covering the cell region 105 and also other device regions (not shown), such as I/O device region, at the same time. The process for forming the dielectric layer may also be performed separately from other device region. The thickness of the dielectric layer 532a, for example, may be about 5 nm. Other suitable techniques and thicknesses may also be useful.

Figure 5B:
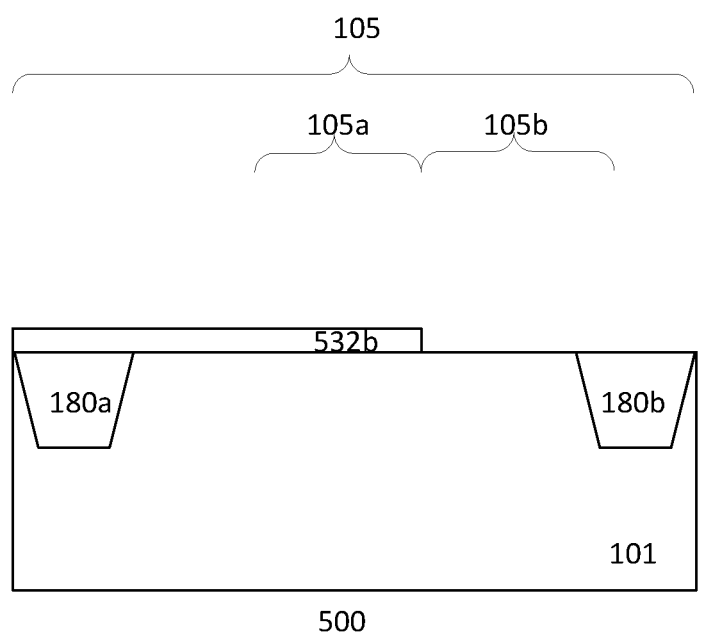

The process continues by removing a portion of the dielectric layer 532a. In one embodiment, the portion of the dielectric layer which is disposed on the second sub-region 105b of the memory cell is removed. In one embodiment, the dielectric layer 532a is patterned. The patterning of the dielectric layer can be achieved, for example, by mask and etch techniques. For example, a patterned soft mask (not shown), such as a photoresist mask, having an opening may be disposed over the dielectric layer 532a. The opening corresponds to the second sub-region of the memory cell. The patterned soft mask, for example, is used as an etch mask for an anisotropic etch, such as a reactive ion etch (RIE). Thus, portion of the dielectric layer exposed by the soft mask opening is removed by etching. Other techniques for patterning the dielectric layer may also be useful. After patterning the dielectric layer, the mask may be removed. The portion of the dielectric layer 532b covered by the soft mask remains on the substrate as shown in FIG. 5b.

Figure 5C:
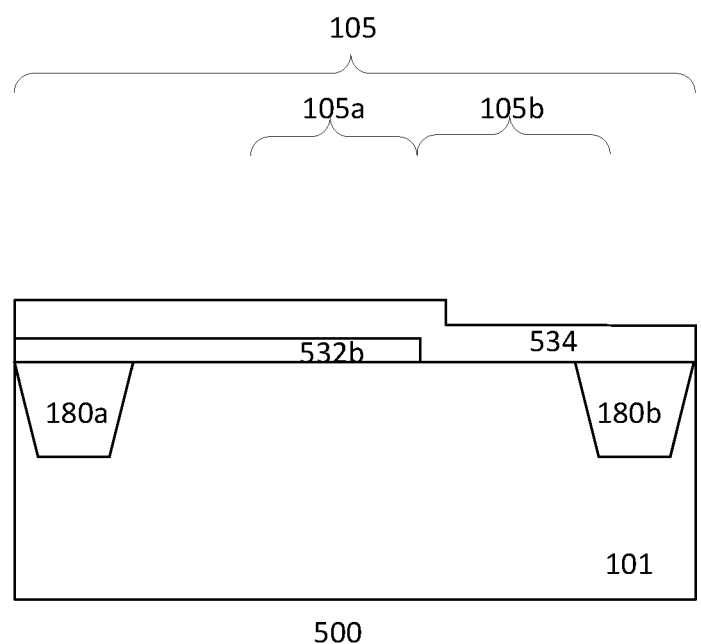

In one embodiment, a programmable resistive layer 534 is formed on the substrate as shown in FIG. 5c. The programmable resistive layer, in one embodiment, is formed or blanket deposited over the substrate and covers the patterned dielectric layer 532b in the memory cell region 105. The programmable resistive layer is formed of a material which can be programmed to be in a high or low resistive state after it has been subjected to a forming process. In one embodiment, the programmable resistive layer is formed of a transitional metal oxide, such as $NiO_2$, $HfO_2$, $ZrO_2$, $Al_2O_3$, $TiO_2$, $Ta_2O_5$, $WO_x$, TiON, GeO, $SiO_2$ and $SnO_2$. Other suitable types of programmable resistive materials may also be useful. The programmable resistive layer is formed by, for example, chemical vapor deposition (CVD), atomic layer deposition (ALD) and other methods. The thickness of the programmable resistive layer may be about 5 nm. Other suitable techniques or other thicknesses may also be useful for the programmable resistive layer.

In one embodiment, the programmable resistive layer includes the same material used for forming gate dielectric of other devices, including the core devices (not shown). Particularly, this is useful when, for example, the core device adopts a high k metal gate scheme. Thus, the programmable resistive layer is simultaneously formed on the memory cell region 105 as well as on other device regions, such as the core regions. This is advantageous as a single step is performed for more than one device regions, simplifying the process flow and reduces cost. In other embodiments, the programmable resistive layer includes different material used for forming gate dielectric of other devices. In this case, the process step for forming the programmable resistive layer is performed separately in the memory device region and other device regions, such as the core region.

Figure 5D:
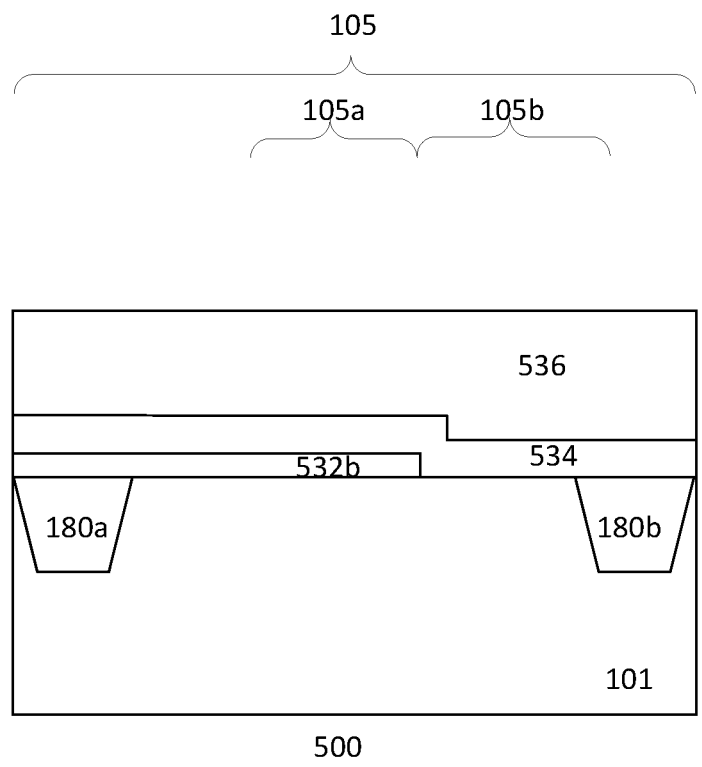

A gate electrode layer 536 is deposited on the programmable resistive layer as shown in FIG. 5d. The gate electrode layer may serve as a top electrode of a memory cell. The gate electrode layer, for example, is the same gate electrode layer used for forming the gate electrode of other devices, such as but not limited to I/O and core devices. The gate electrode, for example, includes polysilicon, metal or metal nitride. Various suitable types of metal, such as Ru, W, Pt, TiN, Ti, Zr, TaN, Si or Al, can be used. Other suitable types of gate electrode materials are also useful, depending on the CMOS process. The thickness of the gate electrode layer can be about 60 nm. Other suitable thicknesses may also be useful. Various techniques can be used to form the gate electrode layer. For example, polysilicon can be deposited by CVD while metal can be deposited by sputtering. Other processes for forming other types of gate electrode may also be useful.

Figure 5E:
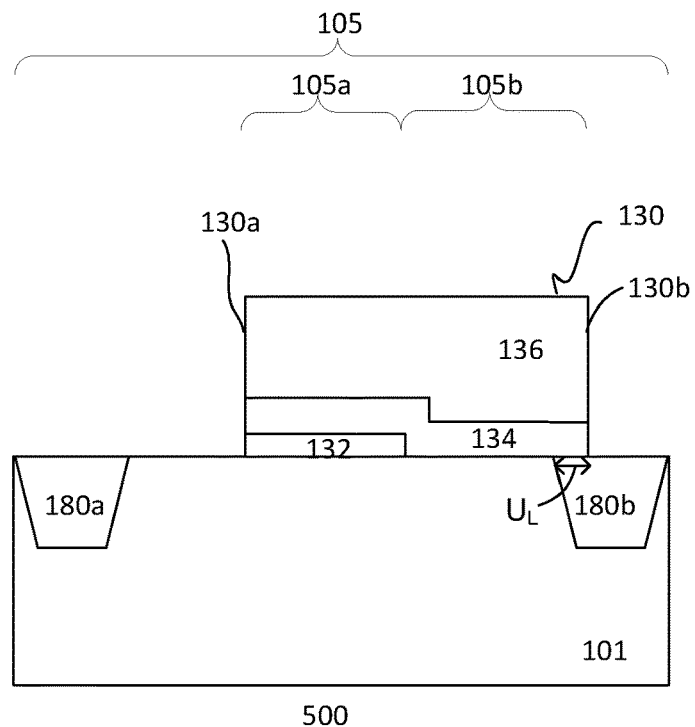

In FIG. 5e, the gate layers, including the patterned dielectric layer 532b, the programmable resistive layer 534 and the gate electrode layer 536, are processed to form a gate structure 130. In one embodiment, the gate layers are patterned to form a gate conductor. The gate conductor may traverse other cell regions. In other embodiments, the gate layers are patterned to form an individual gate in the cell region. The patterning of the gate layers can be achieved, for example, by mask and etch techniques. For example, a patterned soft mask (not shown), such as a photoresist mask, may be used as an etch mask for an anisotropic etch, such as a reactive ion etch (RIE). Other techniques for patterning the gate layers may also be useful.

The gate structure, as shown in FIG. 5e, includes a dielectric layer 132, programmable resistive layer 134 and a gate electrode 136. The dielectric layer 132, as shown, is disposed over the first sub-region 105a while the programmable resistive layer 134 and the gate electrode 136 are disposed over the first and second sub-regions 105a-105b. The length of the dielectric layer 132, for example, is about 15 nm while the length of the programmable resistive layer and gate electrode, for example, is about 28 nm. Other suitable length dimensions may also be useful. Referring to FIG. 5e, the gate layers are patterned such that a portion of the gate electrode 136 and a portion of the programmable resistive layer 134 overlap a portion of the second isolation region 180b. The isolation region 180b which partially underlaps the gate defines the second sub-region or the programmable region of the memory cell as will be described later.

Figure 5F:
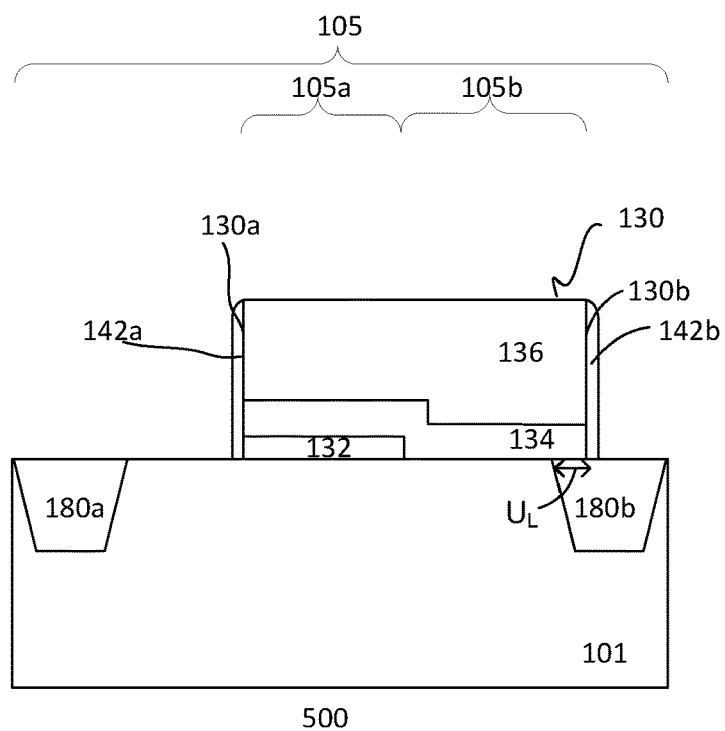

Referring to FIG. 5f, first type spacers 142a-142b are formed on the first and second sidewalls 130a-130b of the gate. A first spacer layer is deposited on the substrate to form the first type spacers 142a-142b. The first spacer layer, for example, may be silicon oxide. Other suitable types of dielectric material, such as silicon nitride, may also be used. The first spacer layer may be formed by CVD. The first spacer layer may also be formed using other techniques. The thickness of the first spacer layer may be, for example, 80 Å. Other thickness ranges may also be useful. The thickness, for example, may depend on the desired width of the first type spacers. An anisotropic etch, such as RIE, may be performed to remove horizontal portions of the first spacer layer, leaving first type spacers 142a-142b on the sidewalls of the gate as shown in FIG. 5f.

Figure 5G:
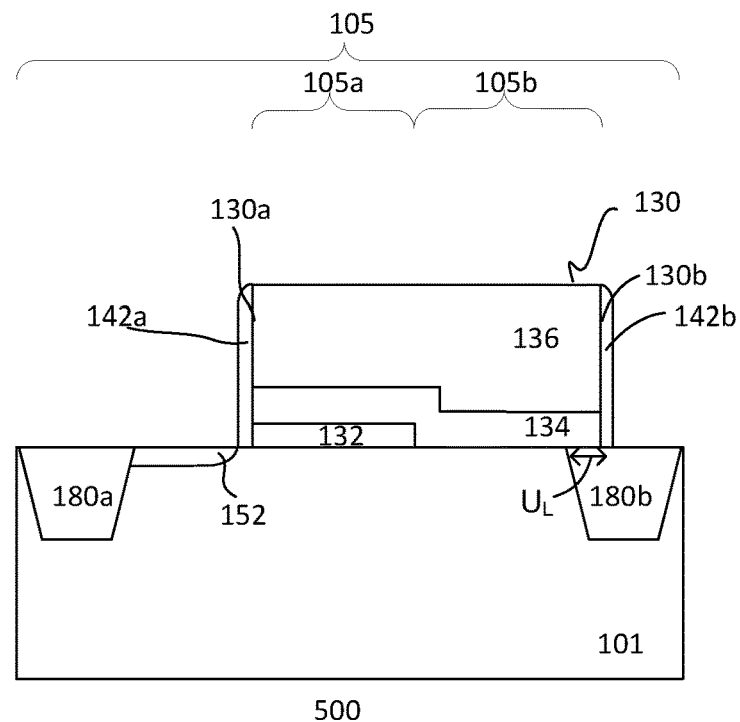

Referring to FIG. 5g, a lightly doped region 152 is formed. The lightly doped region, for example, is formed adjacent to the first type spacer 142a next to the first side 130a of the gate. The lightly doped region has first polarity type dopants. To form the lightly doped region, first polarity type dopants are implanted into the substrate. The implant, for example, may be self-aligned with respect to the first type spacer 142a. For example, the implant may dope the substrate unprotected by the first type spacer 142a, gate and isolation region 180a. The depth of the lightly doped region, for example, is about 20 nm. The implant dose may be about $10^{17}$-$10^{20}$ cm$^{-3}$. Other implant parameters may also be useful. In one embodiment, forming the lightly doped region of the memory cell region also forms lightly doped regions of other device regions, such as the core device regions. The first type spacer 142a, gate and isolation region 180a provide self-alignment of the lightly doped region 152 in the device region. An implant mask which exposes the device region may be provided to perform the implant. The implant mask, for example, may be a photoresist layer. Other suitable types of implant masks may also be useful.

Second type sidewall spacers 140a-140b may be formed on the first type spacers 142a-142b. To form second type sidewall spacers 140a-140b, a second spacer layer is deposited on the substrate. The second spacer layer, for example, may be silicon oxide. Other suitable types of dielectric material, such as silicon nitride, may also be used. The second spacer layer may be formed by CVD. The second spacer layer may also be formed using other techniques. The thickness of the second spacer layer may be, for example, 150 Å. Other thickness ranges may also be useful. The thickness, for example, may depend on the desired width of the second type spacers 142a-142b. An anisotropic etch, such as RIE, may be performed to remove horizontal portions of the second spacer layer, leaving second type spacers 140a-140b on the sidewalls of the first type spacers as shown in FIG. 5h.

Figure 5H:
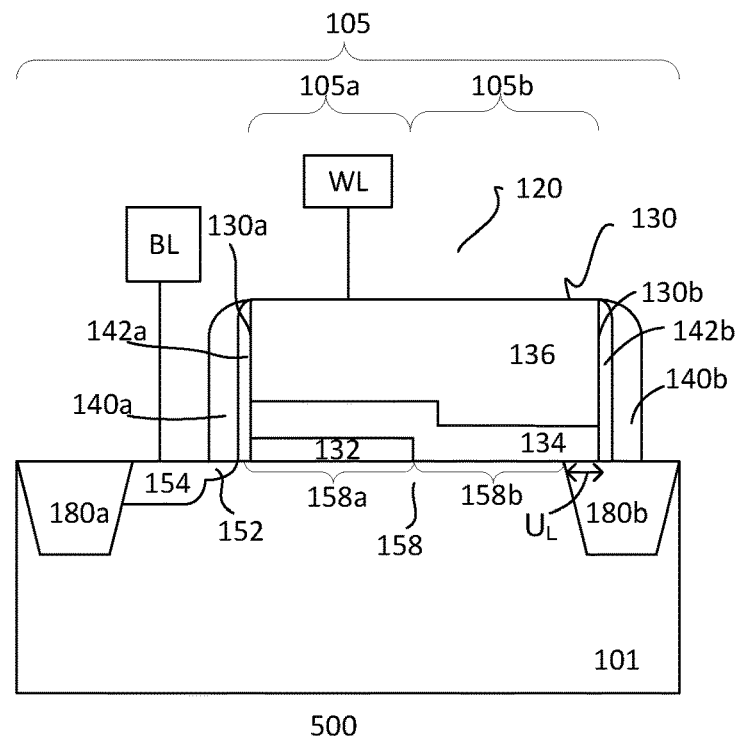

Referring to FIG. 5h, a heavily doped region 154 is formed in the substrate. The heavily doped region, in one embodiment, is formed adjacent to the first side 130a of the gate. The heavily doped region has first polarity type dopants. Forming the heavily doped region includes implanting first polarity type dopants into the substrate. The implant, like the one that forms the lightly doped region, is self-aligned with respect to the device region. For example, the dopants may be doped into the substrate unprotected by the gate, sidewall spacers 140a and 142a and isolation region 180a. In this case, the sidewall spacer 140a caused the heavily doped region to be offset, creating a source region which includes a lightly doped source portion 152 and a heavily doped deeper portion 154. The depth of the heavily doped region, for example, is about 80 nm. The implant dose may be about $10^{18}$-$3 \times 10^{20}$ cm$^{-3}$. Other suitable implant parameters may also be useful. In one embodiment, forming the heavily doped region in the source region of the memory cell region also forms heavily doped source and drain regions of other device regions, such as I/O and core device regions.

A channel region 158 of the transistor 120, in one embodiment, includes a first sub-region 158a and a second sub-region 158b. In one embodiment, the first sub-region 158a of the channel region is disposed adjacent to the source region while the second sub-region 158b of the channel region is disposed adjacent to the isolation region 180b which partially underlaps the gate. The source region 154 defines the access portion while the isolation region 180b which partially underlaps the gate defines the programmable portion of the memory cell.

The process may continue to complete the memory cell 120 until a memory cell shown in FIG. 5h which is the same as FIGS. 1a-1b is formed. For example, metal silicide contacts (not shown) may be formed on the gate electrode and source region. The metal silicide contacts, for example, may be nickel-based metal silicide contacts. Other types of metal silicide contacts may also be useful. The metal silicide contacts facilitate reduced contact resistance. To form silicide contacts, a metal layer may be deposited over the substrate and annealed to cause a reaction with silicon. Unreacted metal are removed by, for example, a wet etch, leaving the silicide contacts on the gate electrode the source region. Additional processes further include forming a dielectric or ILD layer (not shown), bitline contacts, wordline contacts to the terminals of the memory cell or transistor as well as one or more interconnect levels, final passivation, dicing, assembly and packaging. Other processes may also be included. For example, other components, such as low voltage, medium voltage, and high voltage I/O devices can be formed prior to forming the interconnections.

Figure 6A:
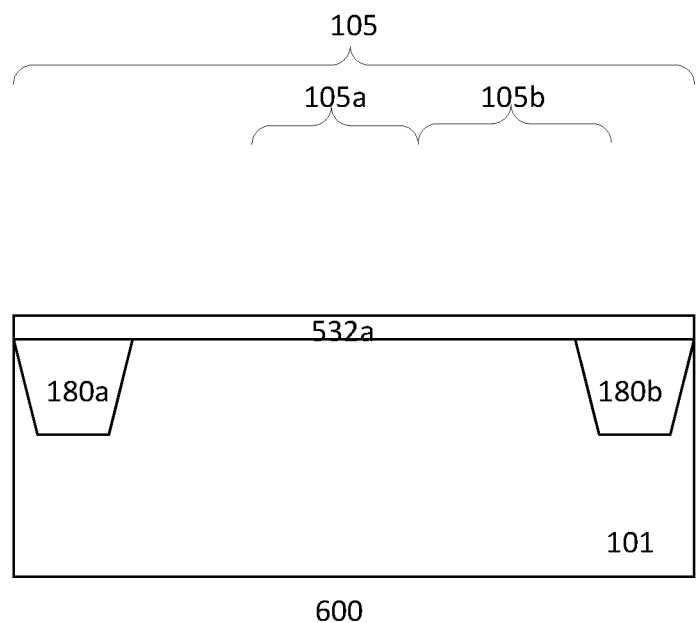

FIGS. 6a-6h show cross-sectional view of another embodiment of a process for forming a device or IC 600. Referring to FIG. 6a, a substrate 101 is provided. The substrate is at the stage of processing as described in FIG. 5a. For example, the substrate is prepared with STI regions 180a-180b surrounding the device region and a dielectric layer 532a over the surface of the substrate in the cell region and other device regions (not shown). As such, common features will not be described or described in detail.

Figure 6B:
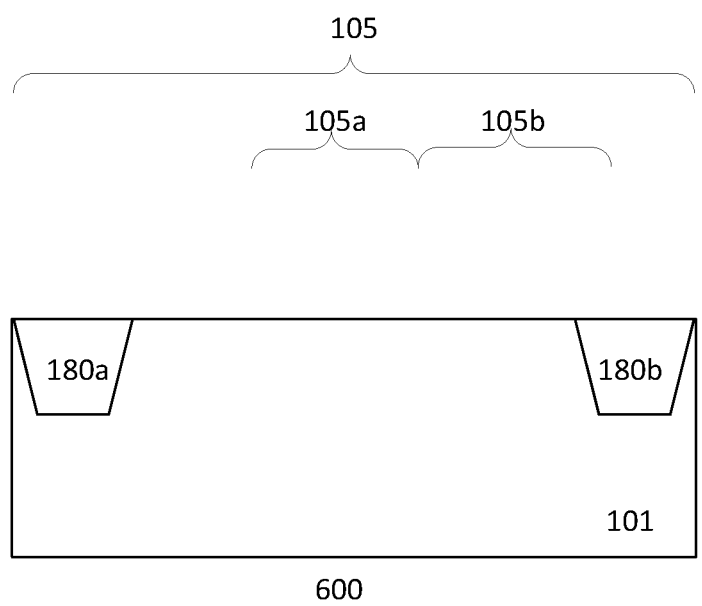

The process continues by removing the dielectric layer 532a over the memory cell region as shown in FIG. 6b. In one embodiment, the dielectric layer 532a which is disposed on the cell region 105 is removed. In one embodiment, the dielectric layer 532a is patterned. The patterning of the dielectric layer can be achieved, for example, by mask and etch techniques, similar to that described in FIG. 5b. For example, a patterned soft mask (not shown), such as a photoresist mask, having an opening which corresponds to the memory cell region is formed over the dielectric layer. The portion of the dielectric layer exposed by the soft mask opening is removed similar to that described in FIG. 5b. The portion of the dielectric layer covered by the soft mask remains on other device regions (not shown), such as the I/O device region, on the substrate.

Figure 6C:
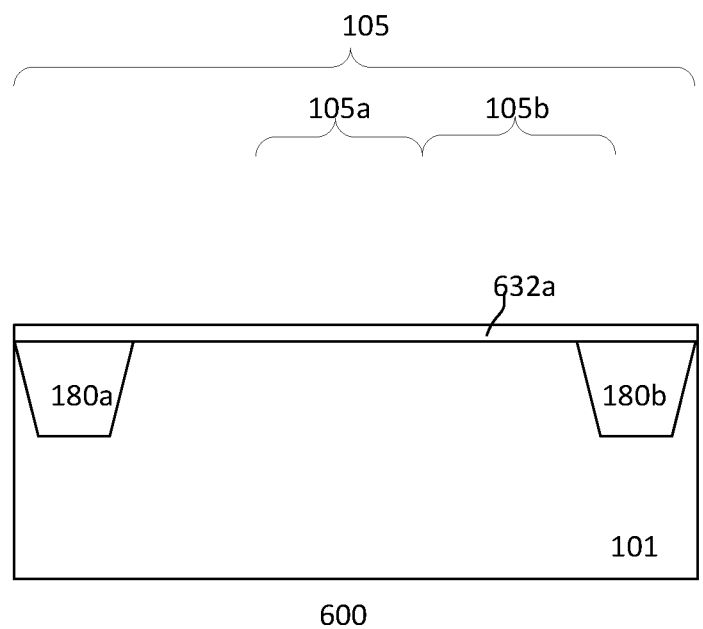

Referring to FIG. 6c, the process continues by forming a buffer layer 632a. In one embodiment, the buffer layer is formed in the cell region 105 on top of the substrate. The buffer layer is formed of a material which can be selectively removed with respect to the substrate. In one embodiment, the buffer layer is formed of Ti. Other suitable types of materials which may assist in changing the characteristic of the programmable resistive layer formed thereover such that filaments or conduction paths are easily formed or lowering the $V_{form}$ or $V_{set}$ of the programmable resistive layer may also be useful. The buffer layer is formed by, for example, PVD. The thickness of the buffer layer may be about 5 nm. Other suitable techniques for forming or other thicknesses may also be useful for the buffer layer.

Figure 6D:
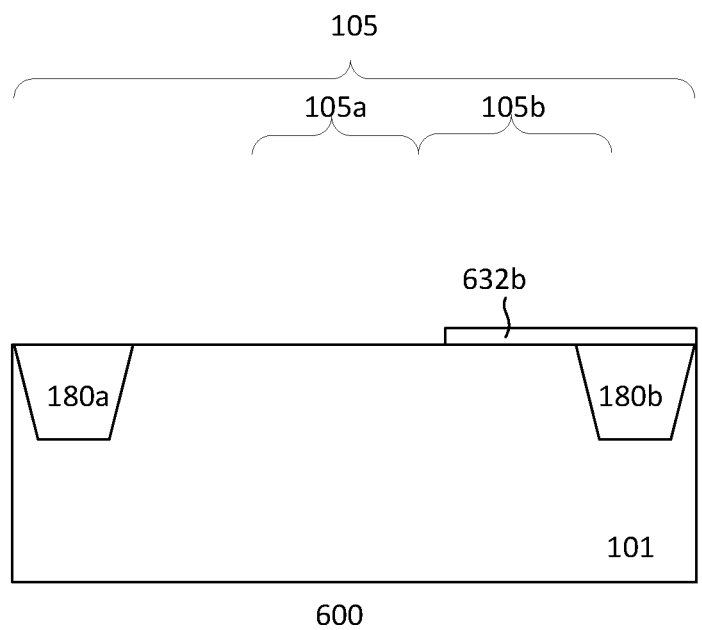

The process continues by removing a portion of the buffer layer 632a. In one embodiment, the portion of the buffer layer which is disposed on the first sub-region 105a of the memory cell is removed. In one embodiment, the buffer layer is patterned. The patterning of the buffer layer can be achieved, for example, by mask and etch techniques. For example, a patterned soft mask (not shown), such as a photoresist mask, having an opening may be disposed over the buffer layer. The opening corresponds to the first sub-region of the memory cell. The patterned soft mask, for example, is used as an etch mask. Thus, portion of the buffer layer exposed by the soft mask opening is removed by a wet etch. Other techniques for patterning the buffer layer may also be useful. The etch, for example, stops on the top surface of the substrate. After patterning the buffer layer, the mask may be removed. The portion of the buffer layer 632b covered by the soft mask which partially overlaps the isolation region 180b remains on the substrate as shown in FIG. 6d.

Figure 6E:
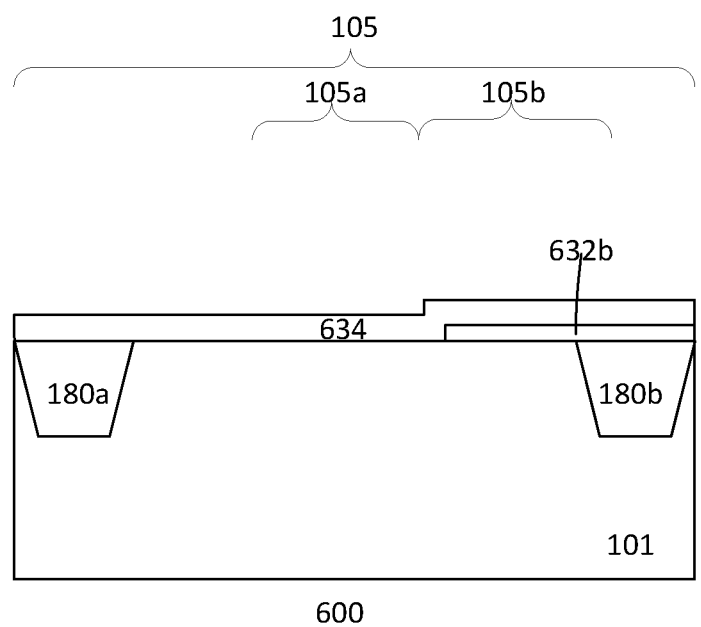

In one embodiment, a programmable resistive layer 634 is formed as shown in FIG. 6e. The programmable resistive layer, in one embodiment, is formed over the substrate and covers the patterned buffer layer 632b. The programmable resistive layer is formed of a material which can be programmed to be in a high or low resistive state after it has been subjected to a forming process. In one embodiment, the programmable resistive layer is formed of a transitional metal oxide such as those described in, for example, FIG. 5c. As such, details of the programmable resistive layer will not be described or described in detail.

Figure 6F:
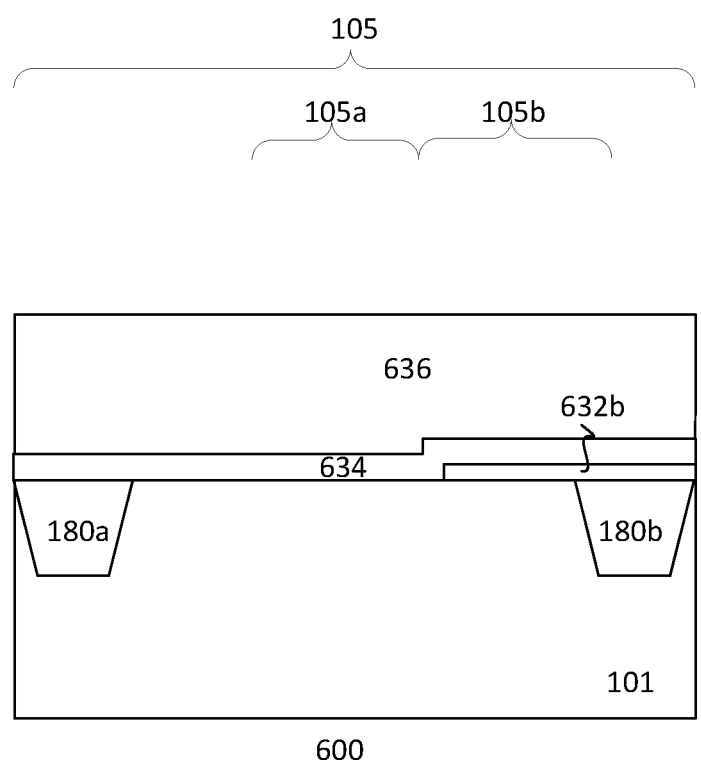

A gate electrode layer 636 is deposited on the programmable resistive layer 634 as shown in FIG. 6f. The gate electrode layer, for example, is the same gate electrode layer used for forming the gate electrode of other devices, such as I/O and core devices. The gate electrode, for example, includes materials such as those described in, for example, FIG. 5d. As such, details of the gate electrode layer will not be described or described in detail.

The gate layers, including the patterned buffer layer 632b, the programmable resistive layer 634 and the gate electrode 636, are processed to form a gate structure 230. The patterning of the gate layers can be achieved, for example, by mask and etch techniques as already described in FIG. 5e. As such, the details of this process step will not be described.

Figure 6G:
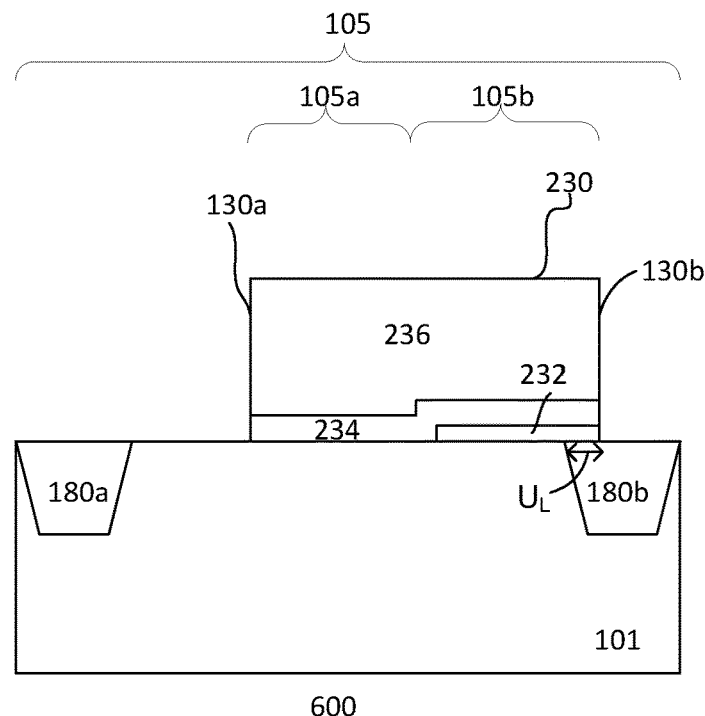
Figure 6H:
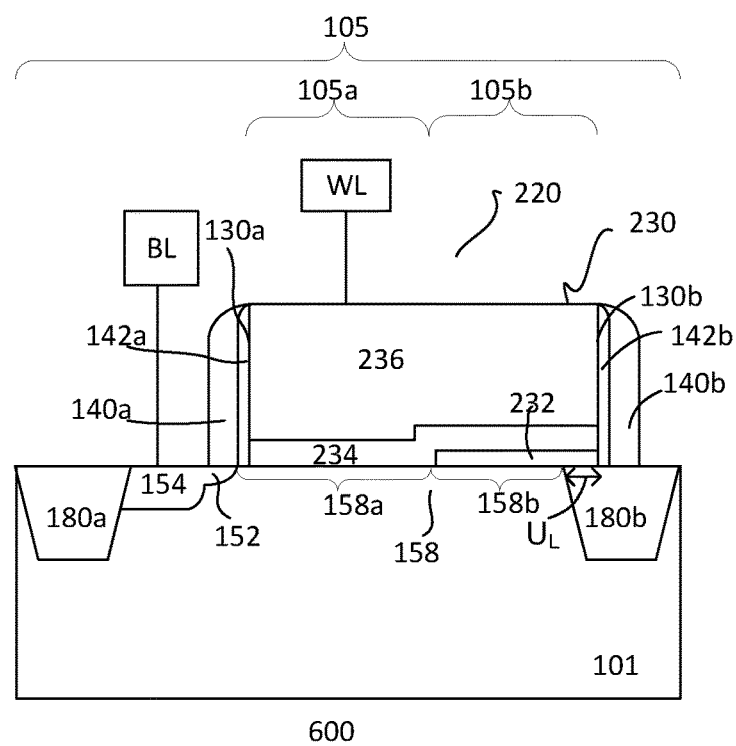

The gate structure 230, as shown in FIG. 6g, includes a buffer layer 232, a patterned programmable resistive layer 234 and a gate electrode 236. The buffer layer 232, as shown, is disposed over the second sub-region 105b while the programmable resistive layer 234 and the gate electrode 236 are disposed over the first and second sub-regions 105a-105b. The length of the buffer layer 232, for example, is about 10 nm while the length of the programmable resistive layer and gate electrode, for example, is about 28 nm. Other suitable length dimensions may also be useful. Referring to FIG. 6g, the gate layers are patterned such that a portion of the gate electrode 236 and a portion of the programmable resistive layer 234 overlap a portion of the isolation region 180b. The isolation region 180b which partially underlaps the gate defines the programmable region of the memory cell.

The process may continue from FIGS. 5f and onwards to complete the memory cell. For example, additional processes may include forming lightly doped region 152, sidewall spacers 140a-140b and 142a-142b, and heavily doped source region 154 until a memory cell shown in FIG. 6h which is the same as FIGS. 2a-2b is formed. The process may continue to form metal silicide contacts, ILD layer, bitline contacts, wordline contacts to the terminals of the transistor as well as one or more interconnect levels, final passivation, dicing, assembly and packaging. Details of these processing steps will not be described or described in detail.

Figure 7A:
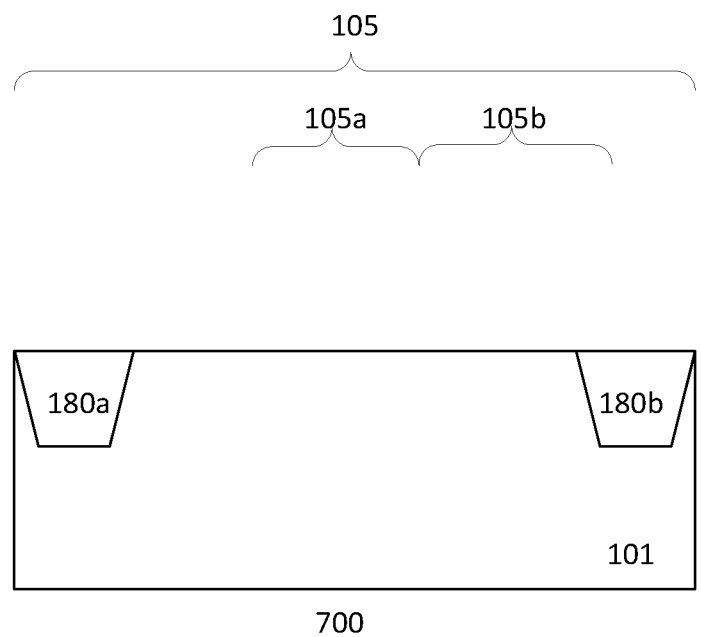

FIGS. 7a-7f show cross-sectional view of another embodiment of a process for forming a device or IC 700. Referring to FIG. 7a, a substrate 101 is provided. The substrate is similar to that described in FIG. 6b. For example, the substrate is prepared with isolation regions 180a-180b surrounding the device region or cell region 105. As such, the substrate and the isolation regions will not be described or described in detail.

Figure 7B:
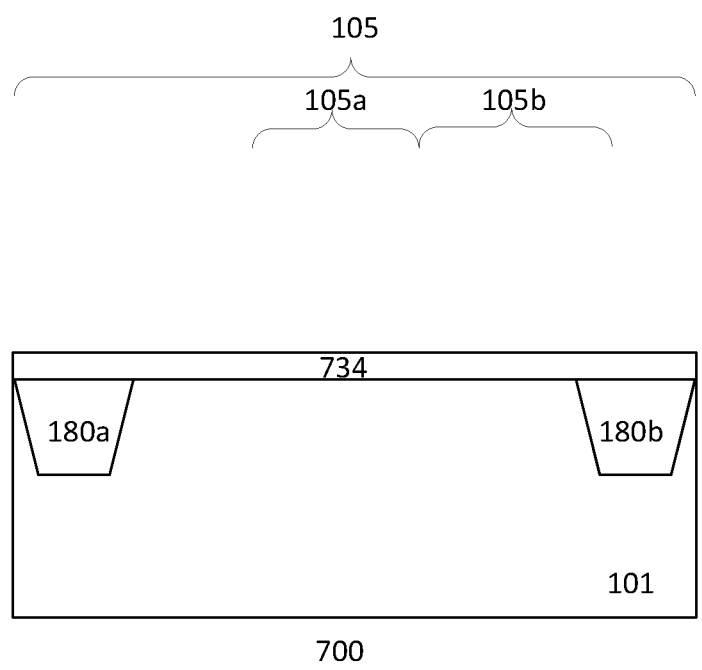

In one embodiment, a programmable resistive layer 734 is formed on the substrate as shown in FIG. 7b. The programmable resistive layer, in one embodiment, is formed over the top surface of the substrate. The programmable resistive layer is formed of a material which can be programmed to be in a high or low resistive state. In one embodiment, the programmable resistive layer is formed of a transitional metal oxide such as those described in, for example, FIG. 5c. As such, details of the programmable resistive layer will not be described or described in detail. The thickness of the programmable resistive layer 734, for example, is about 5 nm. Other suitable thicknesses may also be useful.

Figure 7C:
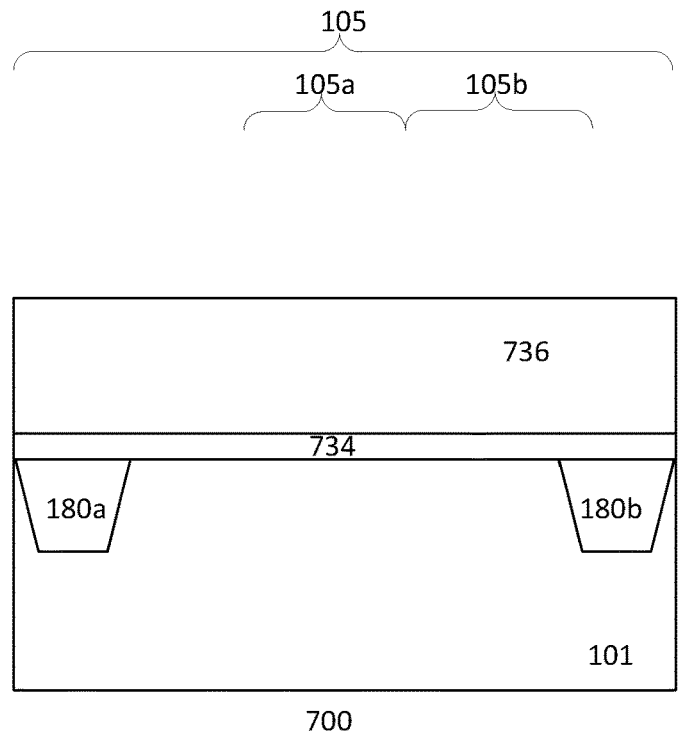

A gate electrode layer 736 is deposited on the programmable resistive layer 734 as shown in FIG. 7c. The gate electrode layer, for example, is the same gate electrode layer used for forming the gate electrode of other devices, such as I/O and core devices. The gate electrode, for example, includes materials such as those described in, for example, FIG. 5d. As such, details of the gate electrode layer will not be described or described in detail.

The gate layers, including the programmable resistive layer 734 and the gate electrode layer 736, are processed to form a gate structure 330. The patterning of the gate layers can be achieved, for example, by mask and etch techniques as already described in FIG. 5e. As such, the details of this process step will not be described.

Figure 7D:
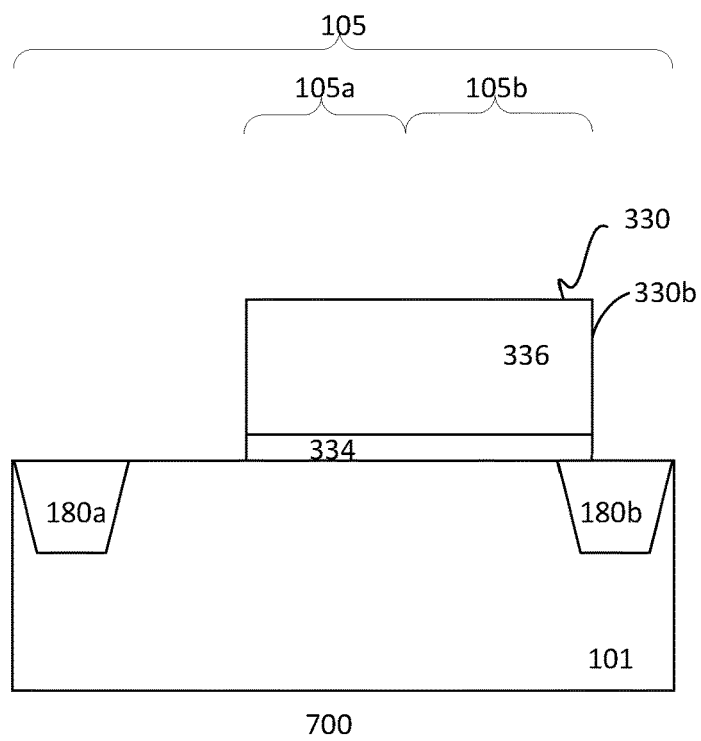

The gate structure 330, as shown in FIG. 7d, includes a patterned programmable resistive layer 334 and a patterned gate electrode 336. The programmable resistive layer 334 and the gate electrode 336 are disposed over the first and second sub-regions 105a-105b. The length of the patterned programmable resistive layer and gate electrode, for example, is about 28 nm. Other suitable length dimensions may also be useful. Referring to FIG. 7d, the gate layers are patterned such that a portion of the gate electrode 336 and a portion of the programmable resistive layer 334 overlap a portion of the isolation region 180b. The isolation region 180b which partially underlaps the gate defines the programmable region of the memory cell.

Figure 7E:
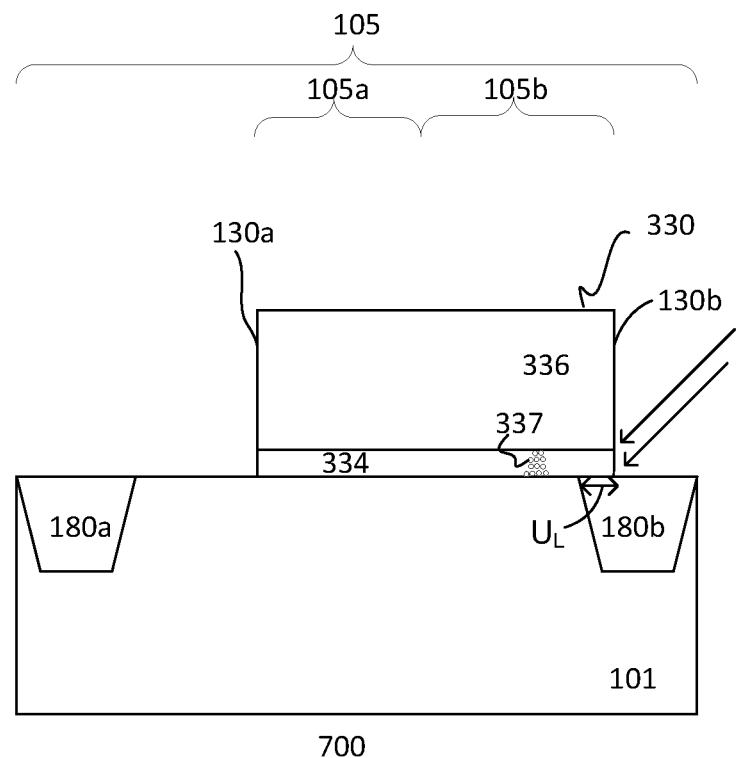
Figure 7F:
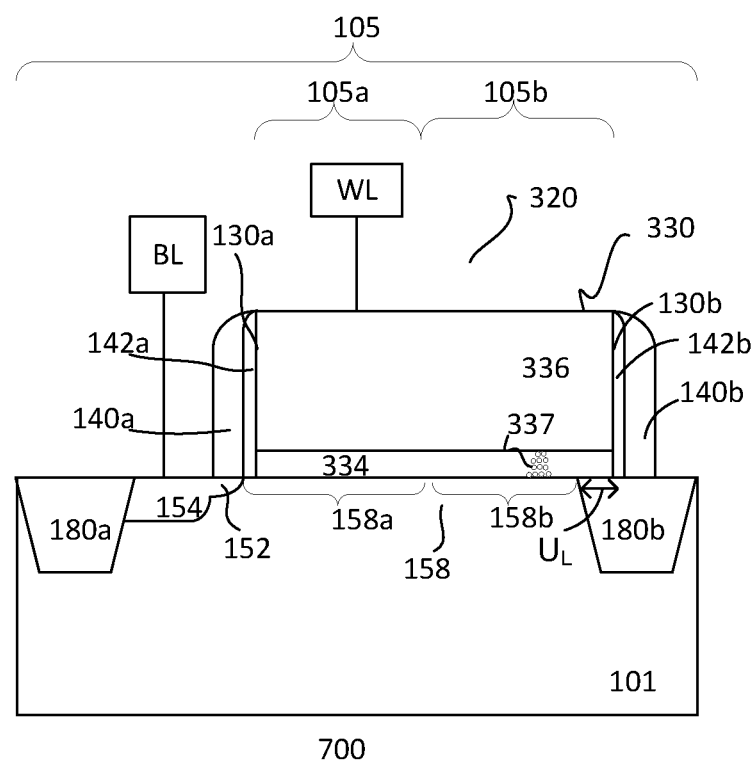

The process continues by implanting dopants into the programmable resistive layer 334. In one embodiment, an implant is performed. The implant implants dopants into a portion of the programmable resistive layer. The implant, in one embodiment, implants metallic dopants 337, such as Gd, Al, etc., into a portion of the programmable resistive layer which is disposed on the programmable area of the memory cell as shown in FIG. 7e. Other suitable types of dopants which may assist in changing the characteristic of the programmable resistive layer such that filaments or conduction paths are easily formed or lowering the $V_{form}$ or $V_{set}$ of the programmable resistive layer may also be useful. The undoped portion of the programmable resistive layer will remain in high resistance state. In one embodiment, the implant is about 10 KeV energy, $10^{10}$-$10^{12}$ dose and 20° tilt angle implant. The implant, for example, may be performed at a tilt angle of 20° with respect to vertical direction (tilt angle is measured from a plane perpendicular to the substrate surface, with 0° being perpendicular to the substrate and 90° being parallel to the substrate surface), such as the second sidewall 130b of the gate. Other implant parameters may also be useful.

The process may continue from FIGS. 5f and onwards to complete the memory cell. For example, additional processes may include forming lightly doped region 152, sidewall spacers 140a-140b and 142a-142b, and heavily doped source region 154 until a memory cell shown in FIG. 7*f* which is the same as FIG. 3*a*-3*b* is formed is formed. The process may continue to form metal silicide contacts, ILD layer, bitline contacts, wordline contacts to the terminals of the transistor as well as one or more interconnect levels, final passivation, dicing, assembly and packaging. Details of these processing steps will not be described or described in detail.

Figure 8A:
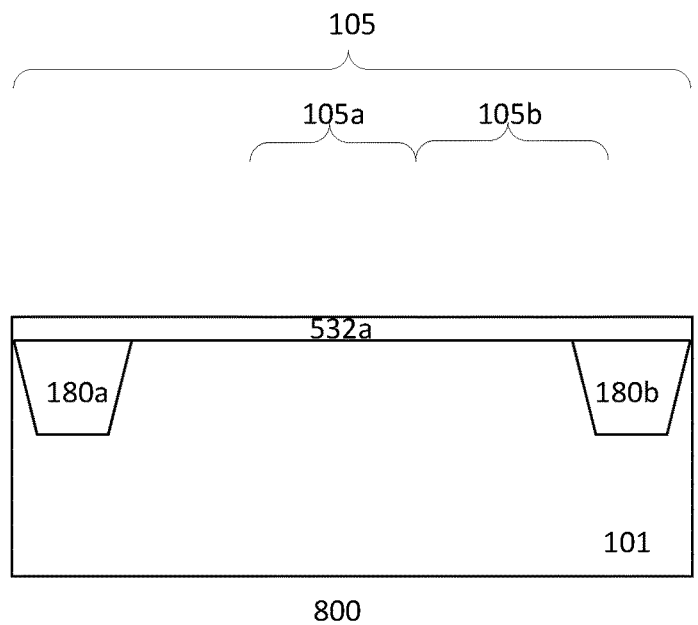

FIGS. 8*a*-8*j* show cross-sectional view of another embodiment of a process for forming a device or IC 800. Referring to FIG. 8*a*, a substrate 101 is provided. The substrate is at the stage of processing as described in FIG. 5*a*. For example, the substrate is prepared with STI regions 180*a*-180*b* surrounding the device region 105 and a dielectric layer 532*a* over the surface of the substrate in the cell region and other device regions (not shown). As such, common features will not be described or described in detail.

Figure 8B:
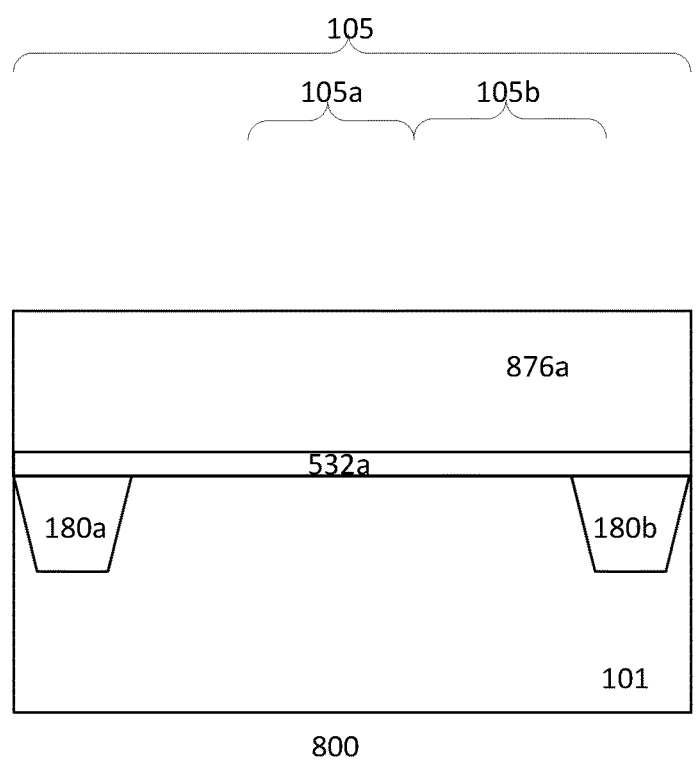

Referring to FIG. 8*b*, a dummy layer 876*a* is formed on top of the dielectric layer 532*a*. In one embodiment, the dummy layer 876*a*, for example, includes the same material used for forming dummy layer of other devices, including the I/O and core devices (not shown). The dummy layer, for example, includes polysilicon. Various other suitable materials and techniques may be employed to form the dummy layer. For example, the dummy layer should be of a material which can be removed or etched selectively to layers below or around it, such as the dielectric layer. The dummy layer may be formed by, for example, CVD covering the cell region and also other device regions (not shown), such as I/O and core device regions, at the same time. Other techniques, such as sputtering or spin coating may also be useful, depending on the material of the dummy layer. The process for forming the dummy layer may also be performed separately from other device regions. The thickness of the dummy layer, for example, is about 60 nm. Other suitable thickness dimensions may also be useful.

Figure 8C:
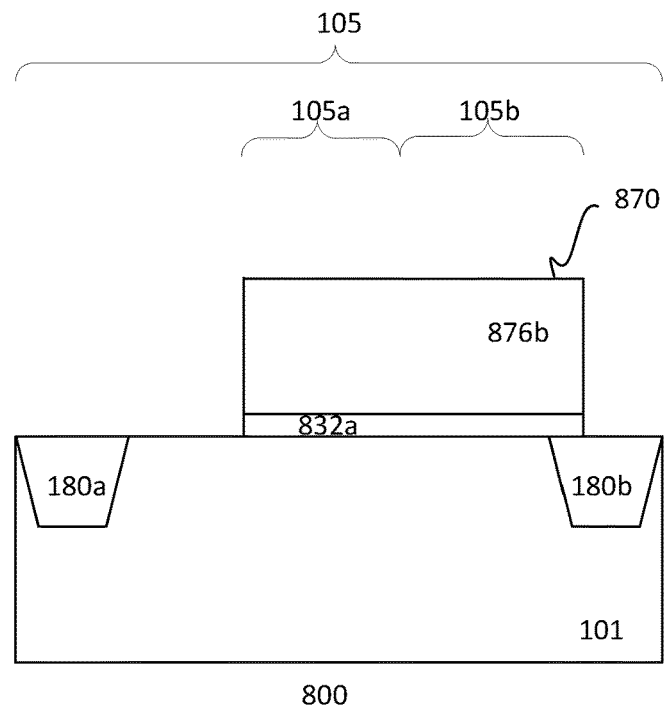

The dielectric and the dummy layers 532*a* and 876*a* are processed. In one embodiment, the dielectric and dummy layers are patterned to form a dummy gate structure 870 which is similar to a gate conductor, as shown in FIG. 8*c*. The patterning of the dielectric and dummy layers can be achieved, for example, by mask and etch techniques, similar to that described in FIG. 5*e*. As such, details of this process step will not be described.

The dummy gate structure 870, as shown in FIG. 8*c*, includes a patterned dielectric 832*a* and a patterned dummy gate 876*b*. The dummy gate structure is disposed over the first and second sub-regions 105*a*-105*b*. The length of the dummy gate structure, for example, is about 28 nm. Other suitable length dimensions may also be useful. Referring to FIG. 8*c*, the dielectric and dummy layers are patterned such that a portion of the dummy gate layer and a portion of the dielectric layer overlap a portion of the isolation region 180*b*. The isolation region 180*b* which partially underlaps the dummy gate structure defines the second sub-region or the programmable region of the memory cell.

Figure 8D:
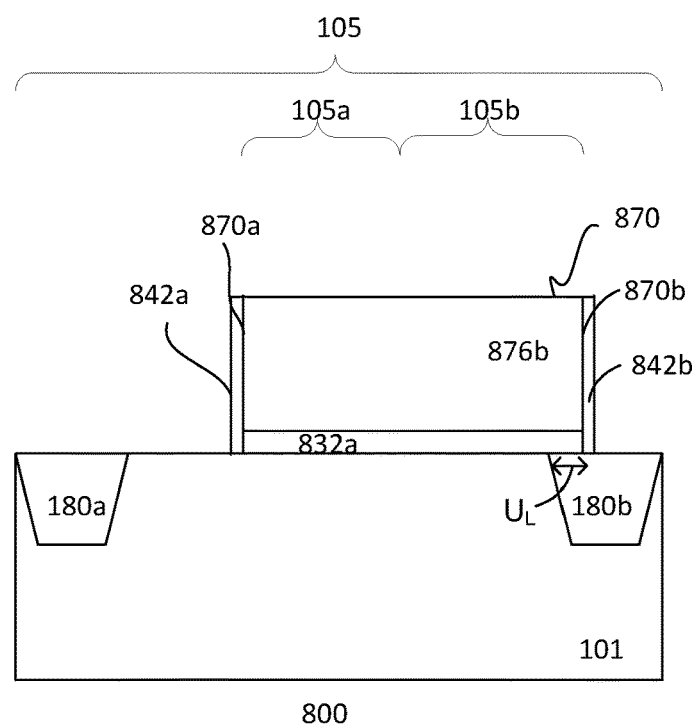
Figure 8E:
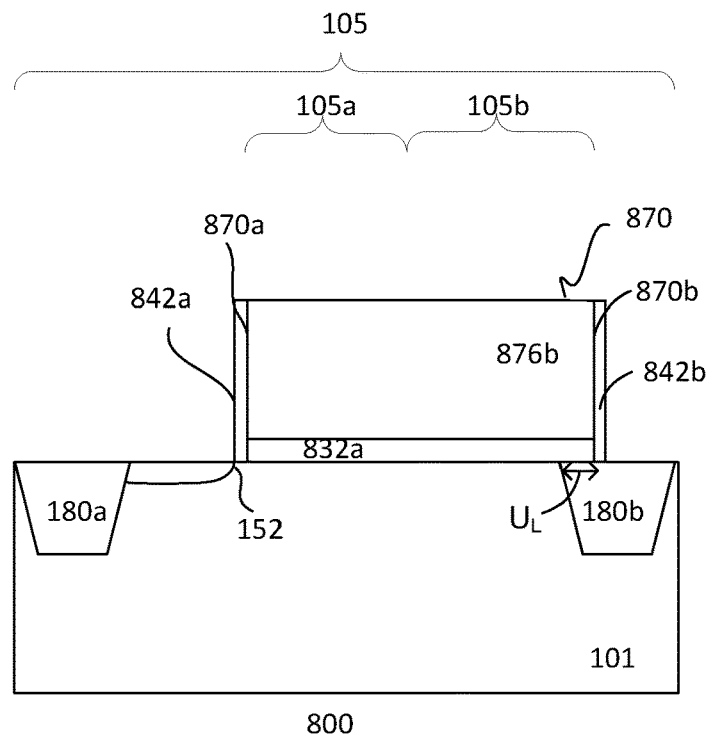

Referring to FIG. 8*d*, first type spacers 842*a*-842*b* are formed adjacent to first and second sidewalls 870*a*-870*b* of the dummy gate 870. Technique for forming the first type spacers is the same as that described in FIG. 5*f*. A lightly doped region 152 is formed in the substrate as shown in FIG. 8*e*. The lightly doped region, for example, is formed adjacent to the first type spacer 842*a* next to the first side 870*a* of the dummy gate structure. The lightly doped region 152 is formed by the same method and dosage and having the same depth as that described in FIG. 5*g*. The implant may dope the substrate unprotected by the first type spacer 842*a*, dummy gate structure and isolation region 180*a*. The first type spacer 842*a*, dummy gate structure and isolation region 180*a* provide self-alignment in the device region.

Second type sidewall spacers 840*a*-840*b* may be formed on the first type sidewall spacers 842*a*-842*b* of the dummy gate structure. The second type sidewall spacers, for example, may be formed by the same method and having the thickness as that described in FIG. 5*h*. For example, an anisotropic etch, such as RIE, may be performed to remove horizontal portions of the second spacer layer, leaving second type spacers on the sidewalls of the dummy gate structure as shown in FIG. 8*f*.

Figure 8F:
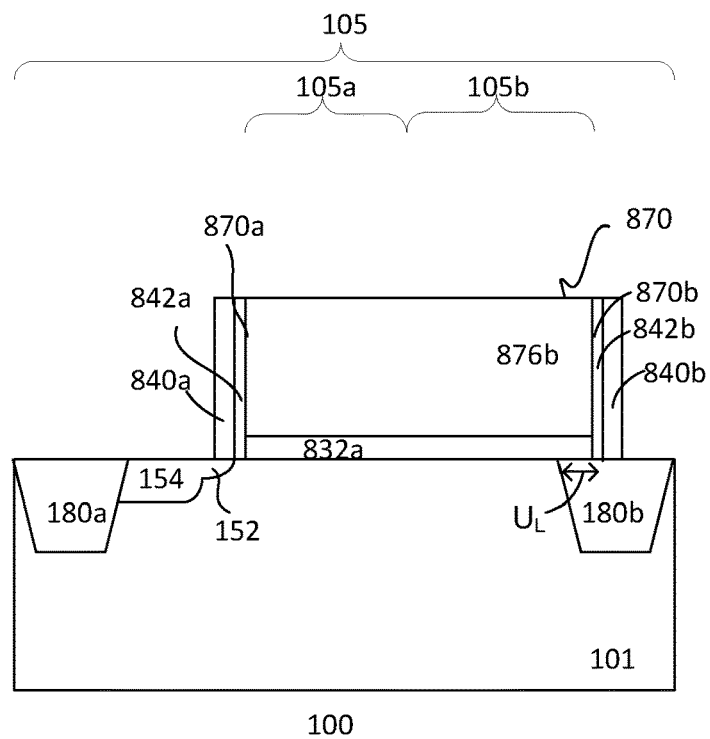

Referring to FIG. 8*f*, a heavily doped region 154 is formed in the substrate. The heavily doped region, in one embodiment, is formed adjacent to the second type spacer 840*a* next to the first side 870*a* of the dummy gate structure. The heavily doped region, for example, may be formed by the same method and dosage and having the same depth as that described in FIG. 5*h*. In this case, the sidewall spacer 840*a* caused the heavily doped source region to be offset, creating a source region 154 which includes a lightly doped source portion and a heavily doped deeper portion.

Figure 8G:
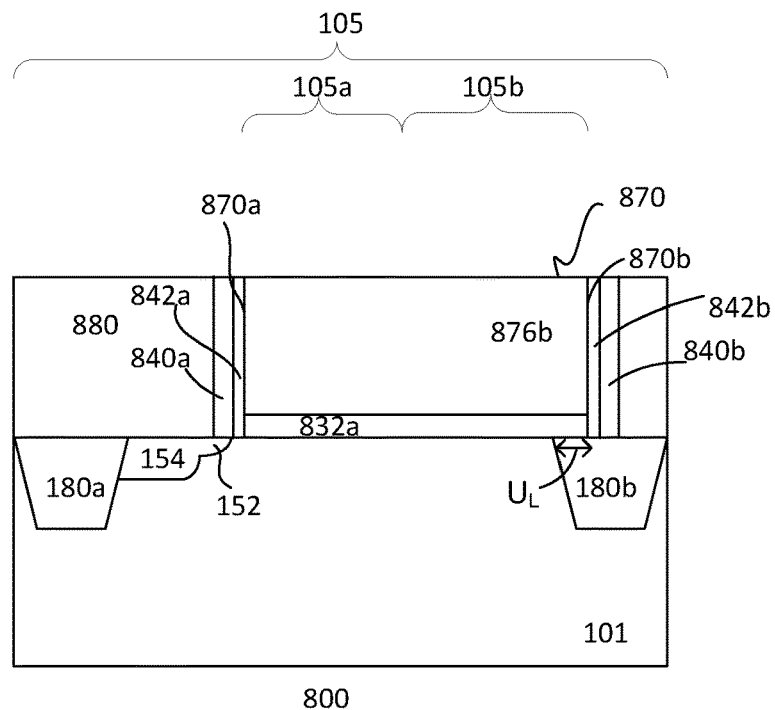

The process continues to form an interlevel dielectric (ILD) layer 880. Referring to FIG. 8*g*, an interlevel dielectric (ILD) layer is deposited conformally over the substrate. The ILD, for example, may be formed of silicon oxide. Other types of dielectric material may also be useful. Preferably, the ILD is formed of a material which the dummy gate may be selectively removed to the ILD layer. The ILD may be formed by CVD. Other techniques for forming the ILD layer may also be useful. Excess dielectric material of the ILD layer is removed by a planarization process. In one embodiment, the excess material may be removed by CMP. Other types of planarization processes may also be useful. The CMP, for example, may use the dummy gate as a CMP stop. For example, the CMP forms a coplanar surface with the ILD and the dummy gate and the sidewall spacers as shown in FIG. 8*g*.

Figure 8H:
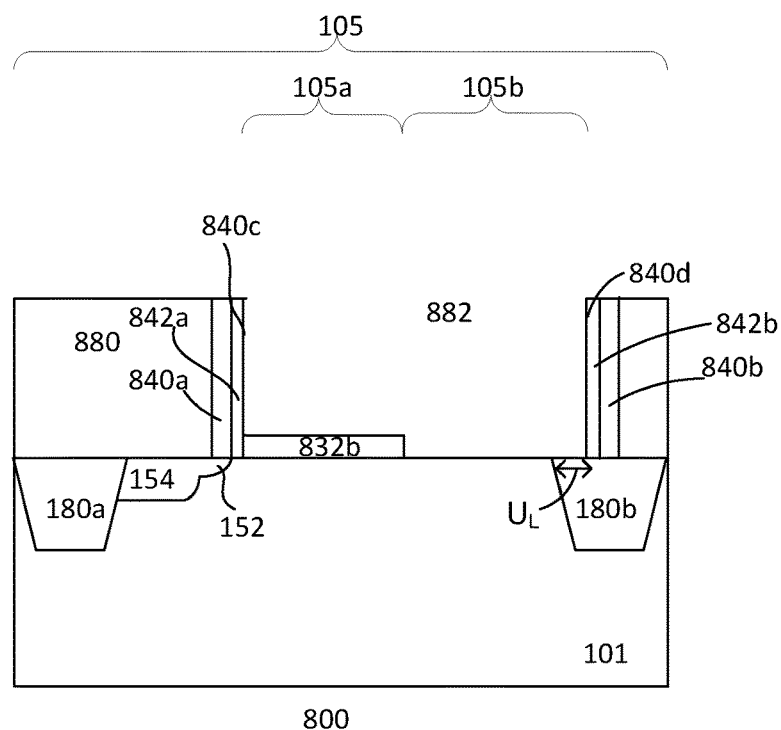

The process continues by removing the dummy gate 876*b* and a portion of the dielectric layer 832*a* as shown in FIG. 8*h*. A dual etch process using different chemistries, for example, may be employed to remove the dummy gate and a portion of the dielectric layer. For example, a dry etch followed by a wet etch/clean process are performed to remove the dummy gate 876*b* by etch selectivity control of the dummy gate to the dielectric layer and spacers. As for the removal of a portion of the dielectric layer 832*a*, in one embodiment, it is partially removed together with the removal of gate dielectric layer used for I/O device which is disposed over the core region using the same mask and etch process. The portion of the dielectric layer 832*b* protected by the mask remains. Other techniques for removing the dummy gate and a portion of the dielectric layer may also be useful. In one embodiment, the portion of the dielectric layer which is disposed on the second sub-region 105*b* of the memory cell is removed. The second sub-region, for example, corresponds to the programmable area of the memory cell. The removal of the dummy gate forms a gate opening 882 which exposes the remaining portion 832*b* of the dielectric layer over the first sub-region 105*a* and a portion of the top surface of the substrate. The opening 882, for example, also exposes sides 840*c*-840*d* of the sidewall spacers which are away from the ILD as shown in FIG. 8*h*.

Figure 8I:
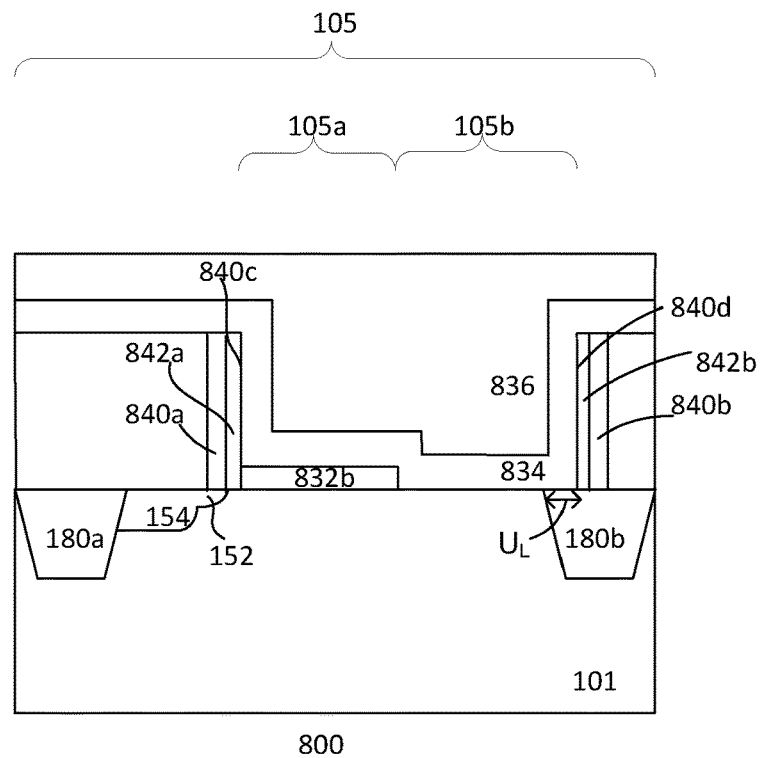

The process continues by forming a programmable resistive layer 834 and a gate electrode layer 836 as shown in FIG. 8*i*. The programmable resistive layer and the gate electrode layer include materials as disclosed, for example, in FIGS. 5c and 5d. For example, the gate electrode layer 836 includes metal material. As such, details of the programmable resistive and gate electrode layer will not be described or described in detail. The thickness of the programmable resistive layer 834, for example, may be about 5 nm. Other suitable thickness ranges may also be useful. As shown, the programmable resistive and gate electrode layers are conformally formed on the substrate. For example, the programmable resistive layer lines the ILD, exposed sides of the sidewall spacers, top and sides surfaces of the dielectric layer 832b and the exposed portion of the substrate while the gate electrode layer covers the programmable resistive layer and fills the gate opening. The programmable resistive layer may be formed by, for example, atomic layer deposition technique while the gate electrode layer is formed by sputtering or CVD. Forming the programmable resistive and gate electrode layers by other techniques may also be useful.

Figure 8J:
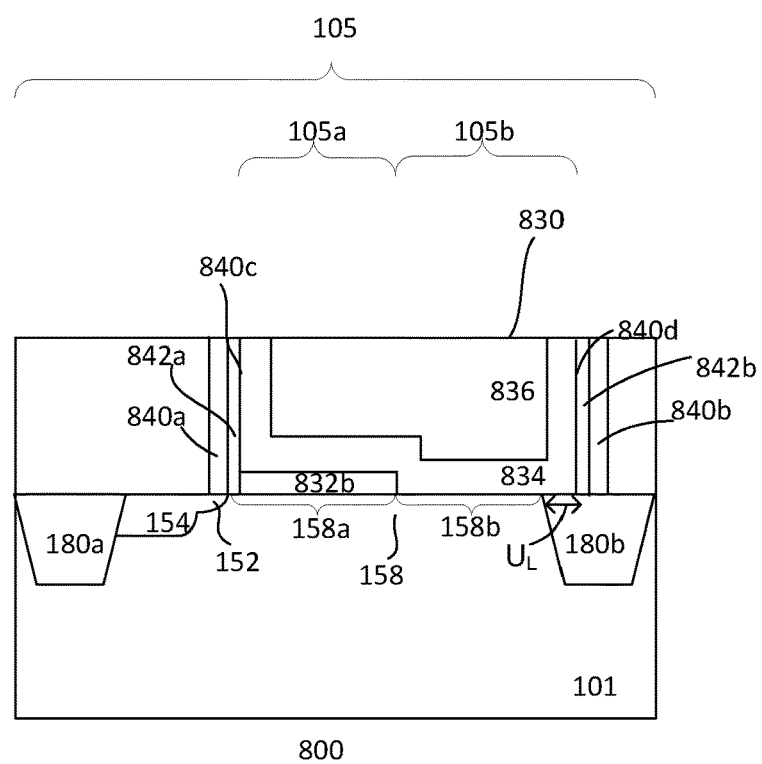

Referring to FIG. 8j, the substrate is planarized to remove excess gate electrode and programmable resistive material. For example, the planarization process removes excess material over the ILD layer. In one embodiment, the planarization process is CMP. Other types of planarization processes may also be useful. The CMP, for example, may use the ILD layer as a CMP stop. The planarization process forms a substantially coplanar surface with the ILD, the sidewalls spacers, the programmable resistive and gate electrode layers. The planarization process forms a gate structure 830 in the gate opening.

Figure 9A:
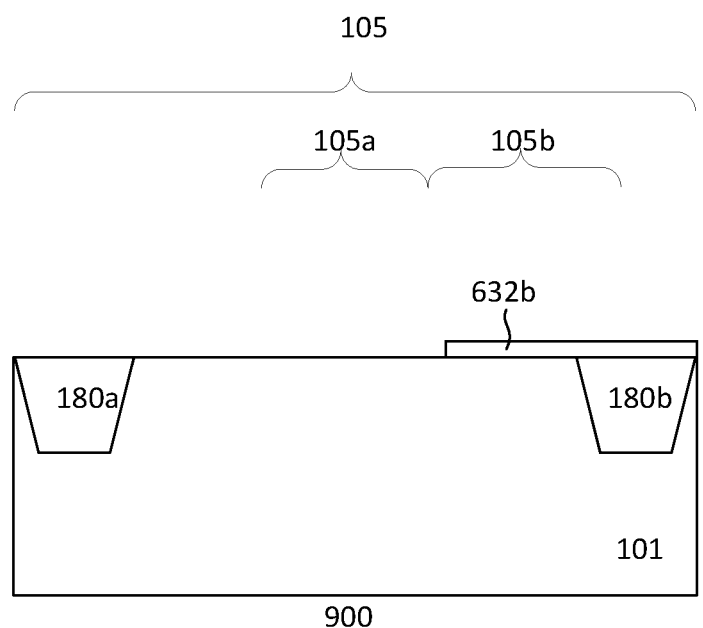

FIGS. 9a-9f show cross-sectional view of another embodiment of a process for forming a device or IC 900. Referring to FIG. 9a, a substrate 101 which is at the stage as described in FIG. 6d is provided. For example, the substrate is prepared with STI regions 180a-180b surrounding the device region and a patterned portion of the buffer layer 632b remains on the substrate. As such, common features will not be described or described in detail.

Figure 9B:
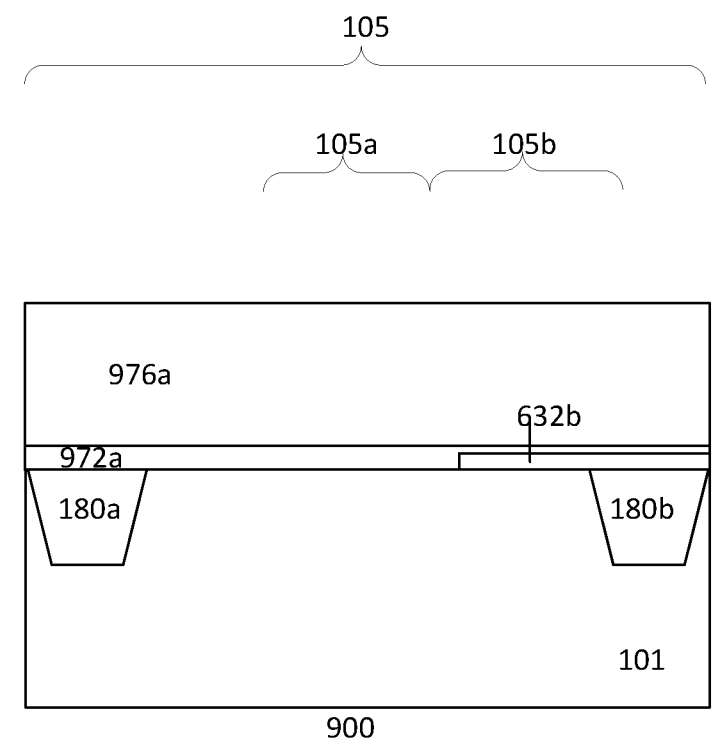

The process continues by forming a dielectric layer 972a and a dummy gate electrode layer 976a over the substrate as shown in FIG. 9b. The dielectric and dummy layers include materials and thicknesses as disclosed, for example, in FIG. 8b. As shown, the dielectric and dummy gate layers are conformally formed on the substrate. For example, the dielectric layer 972a covers the substrate and the patterned buffer layer 632b while the dummy gate electrode layer 976a covers the dielectric layer 972a as shown in FIG. 9b.

Figure 9C:
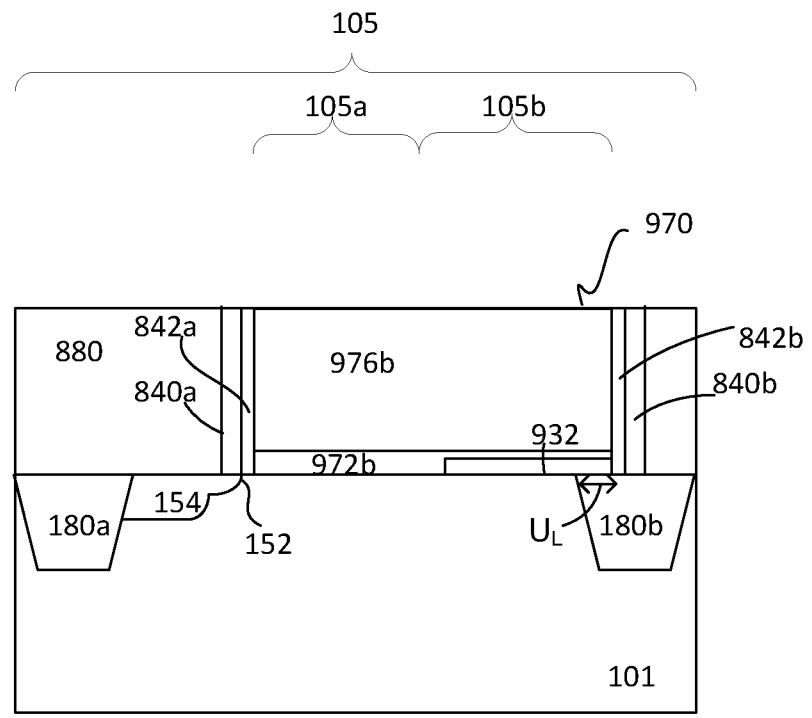
Figure 9D:
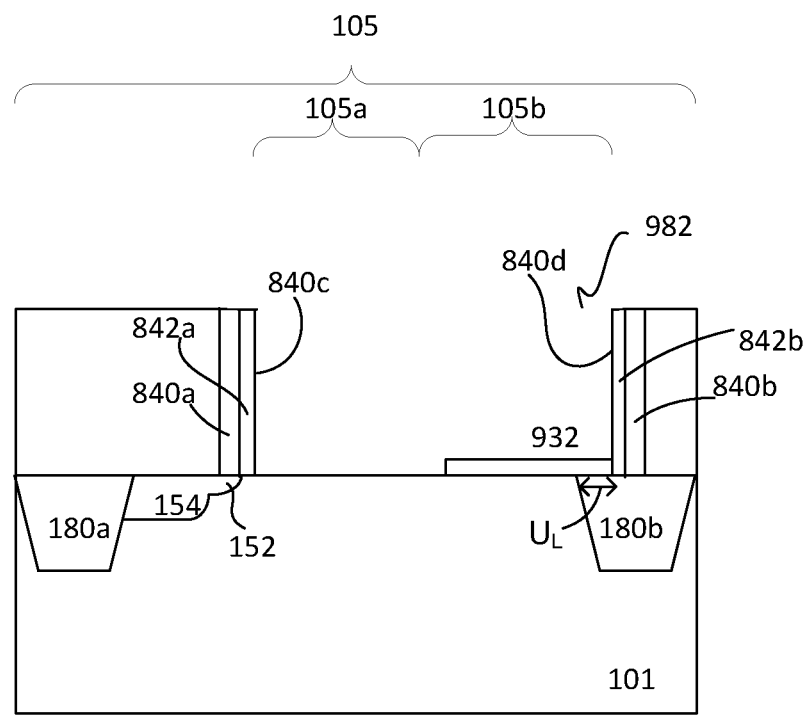

The process continues as described in FIGS. 8c-8g. For example, the dielectric and dummy gate layers 972a and 976a are processed and patterned to form a dummy gate structure 970. Lightly doped region 152, sidewall spacers 842a-842b and 840a-840b, heavily doped region 155 and ILD layer 880 are formed and excess dielectric material of the ILD layer is removed by a planarization process. The CMP forms a substantially coplanar surface with the ILD and the dummy gate and the sidewall spacers as shown in FIG. 9c. As such, details of these process steps will not be described.

Figure 9E:
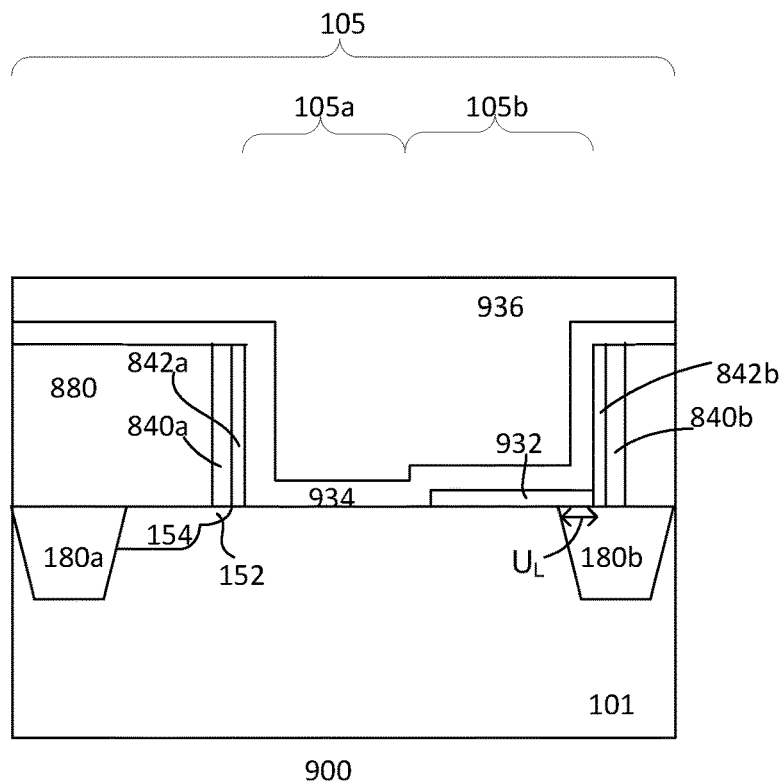

Referring to FIG. 9e, the dummy gate 976b and the dielectric layer 972b are removed. In one embodiment, the dummy gate and the dielectric layer may be removed using the same technique as described with respect to FIG. 8h. As such, details of the removal process will not be described.

Figure 9F:
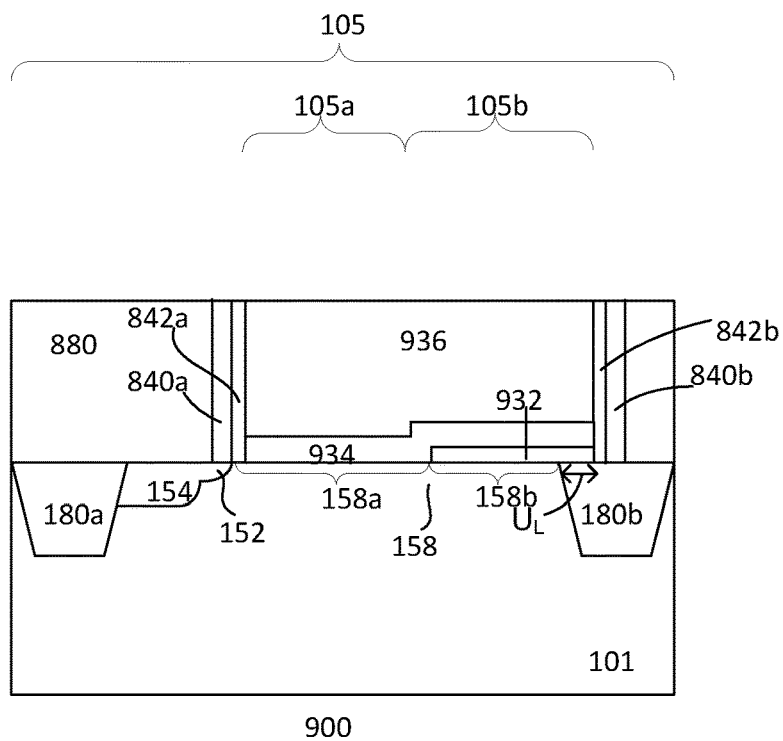

The process continues by forming a programmable resistive layer 934 and a gate electrode layer 936. The programmable resistive layer and the gate electrode layer include materials and formed similarly to that described in FIG. 8i. As shown in FIG. 9e, the programmable resistive and gate electrode layers are conformally formed on the substrate. For example, the programmable resistive layer lines the ILD, exposed sides of the sidewall spacers, the exposed portion of the substrate and top and sides surfaces of the buffer layer while the gate electrode layer covers the programmable resistive layer and fills the gate opening 982. The substrate is planarized to remove excess gate electrode and programmable resistive material. For example, the planarization process removes excess material over the ILD layer. The planarization process forms a coplanar surface with the ILD, the sidewalls spacers, the programmable resistive and gate electrode layers as shown in FIG. 9f. As such, details of these steps will not be described or described in detail.

Figure 10A:
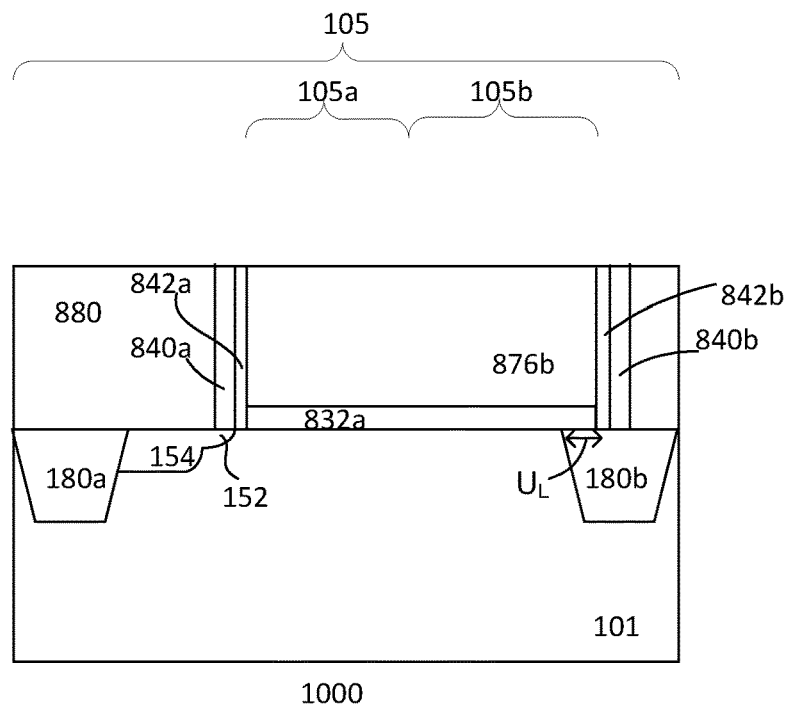

FIGS. 10a-10f show cross-sectional view of another embodiment of a process for forming a device or IC 1000. Referring to FIG. 10a, a substrate 101 which is at the stage of processing as described in FIG. 8g is provided. For example, the ILD, the dummy gate and the sidewall spacers as formed includes substantially coplanar surfaces. As such, common features will not be described or described in detail.

Figure 10B:
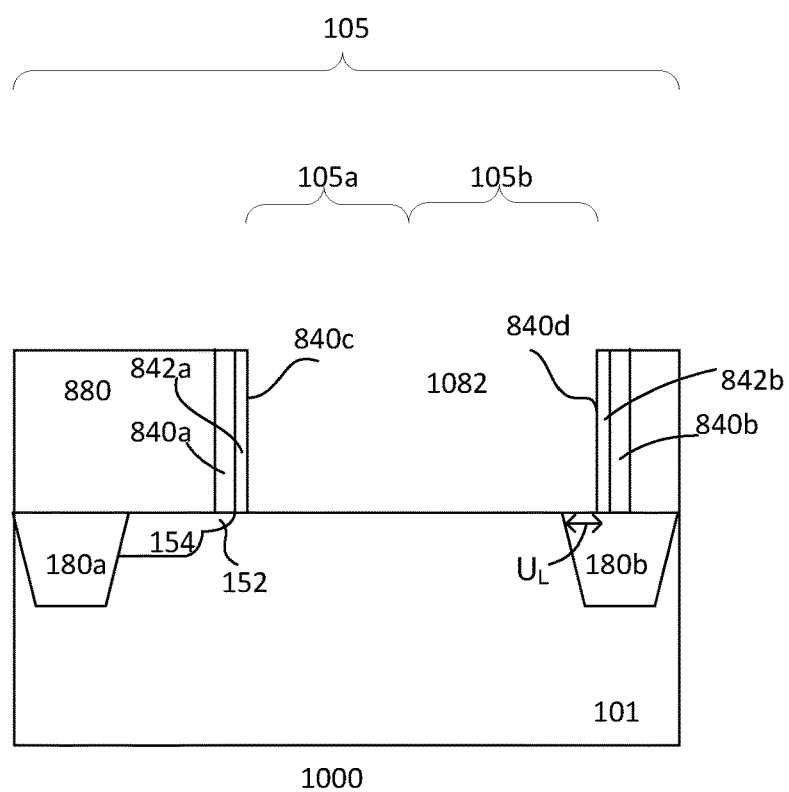

Referring to FIG. 10b, the dummy gate 876b and the dielectric layer 832a are removed. In one embodiment, the dummy gate and the dielectric layer may be completely removed using the technique described in FIG. 9d or FIG. 8h. The removal of the dielectric and the dummy gate forms a gate opening 1082 which exposes the top surface of the substrate. The opening 1082, as shown in FIG. 10b, also exposes sides 840c-840d of the sidewall spacers which are away from the ILD.

Figure 10C:
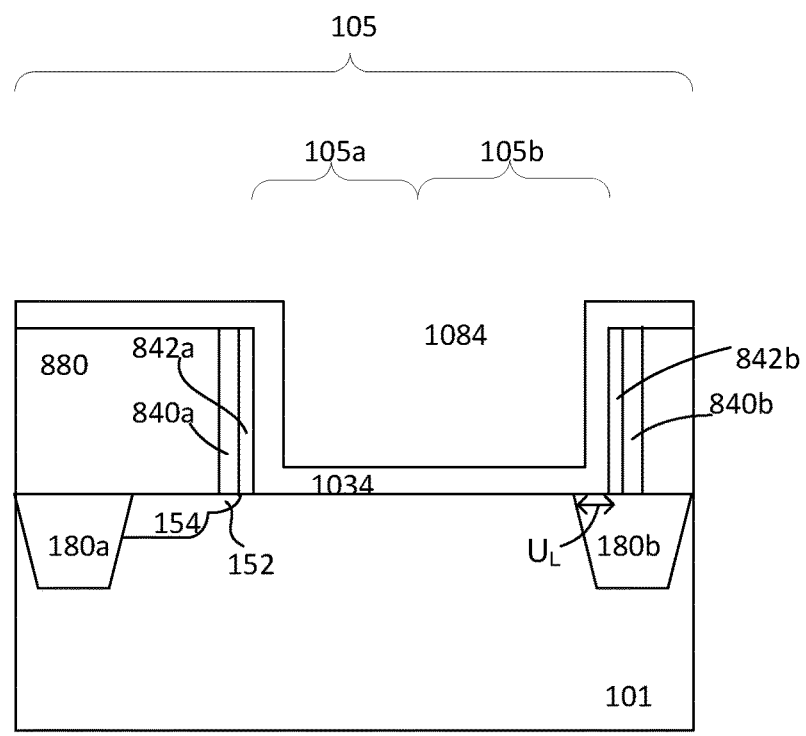

The process continues by forming a programmable resistive layer 1034. The programmable resistive layer includes material and formed similarly to that described in FIG. 8i. As shown in FIG. 10c, the programmable resistive layer 1034 is conformally formed on the substrate 101. For example, the programmable resistive layer lines the ILD 880, exposed sides 840c-840d of the sidewall spacers 842a-842b and the exposed top surface of the substrate. As such, details of these steps will not be described or described in detail.

Figure 10D:
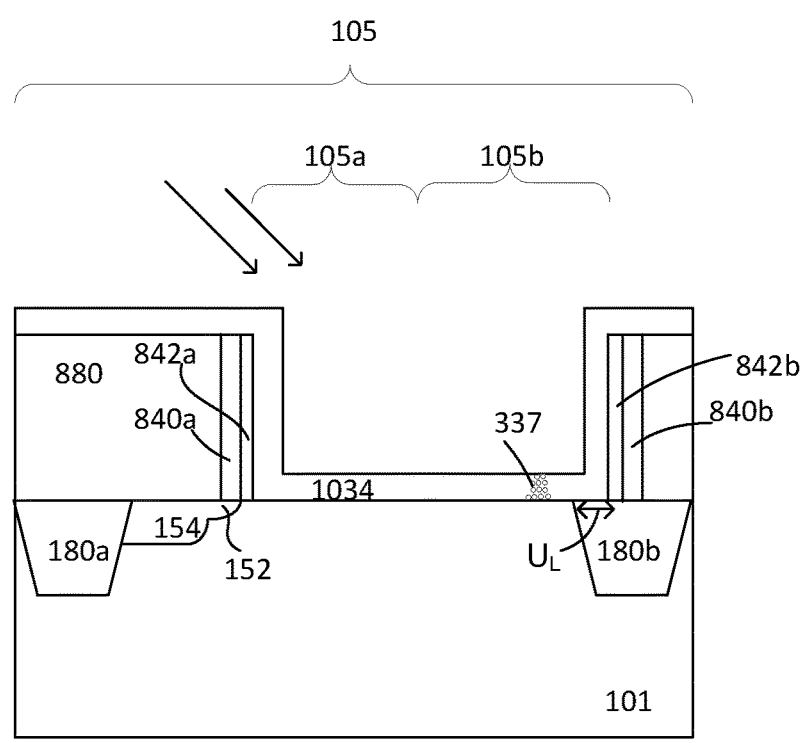

The process continues by implanting dopants into the programmable resistive layer 1034. In one embodiment, an implant is performed. The implant implants dopants into a portion of the programmable resistive layer 1034. The implant, in one embodiment, implants metallic dopants 337, such as Gd, Al, etc., into a portion of the programmable resistive layer which is disposed on the second sub-region 105b of the memory cell as shown in FIG. 10d. Other suitable types of dopants which may assist in changing the characteristic of the programmable resistive layer such that filaments or conduction paths are easily formed or lowering the $V_{form}$ or $V_{set}$ of the programmable resistive layer may also be useful. In one embodiment, the implant is performed at about 10 KeV energy and $10^{10}$-$10^{12}$ dose. The implant, for example, may be performed at a tilt angle of about 20° with respect to vertical direction (tilt angle is measured from a plane perpendicular to the substrate surface, with 0° being perpendicular to the substrate and 90° being parallel to the substrate surface), such as the exposed side 840c of the first sidewall spacer 840a. Other implant parameters may also be useful.

Figure 10E:
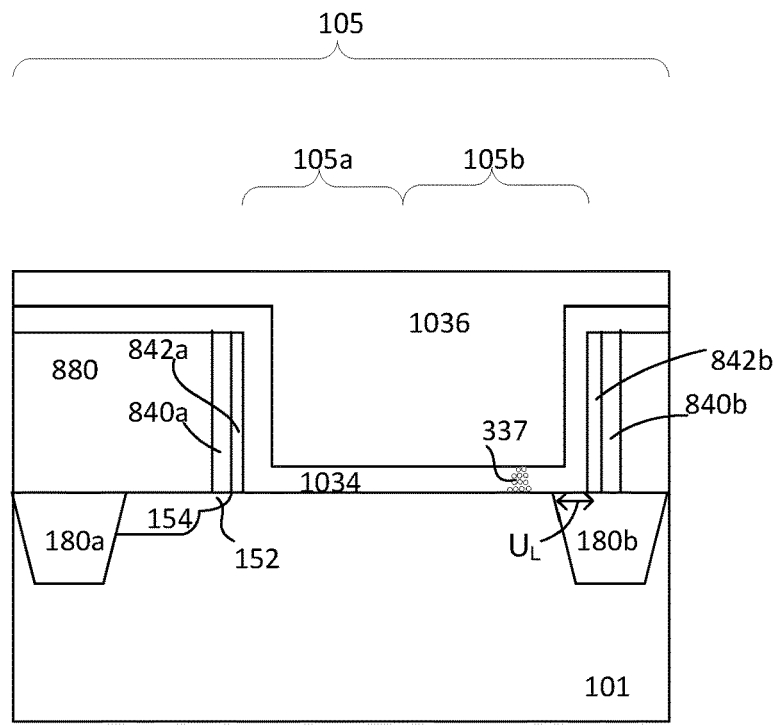
Figure 10F:
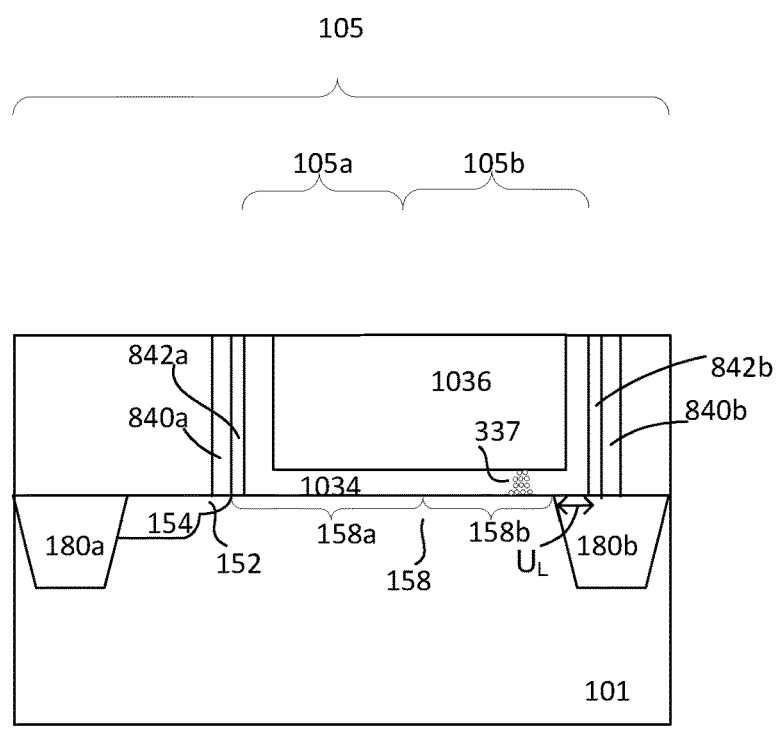

The process continues by forming a gate electrode layer 1036. The gate electrode layer includes material and formed similarly to that described in FIG. 8i. As shown in FIG. 10e, the gate electrode layer is conformally formed on the substrate. For example, the gate electrode layer covers the programmable resistive layer 1034 and fills the gate opening 1084. The substrate is planarized to remove excess gate electrode and programmable resistive material as shown in FIG. 10f. For example, the planarization process removes excess material over the ILD layer. The planarization process forms a coplanar surface with the ILD, the sidewalls spacers, the programmable resistive and gate electrode layers as shown in FIG. 10f. As such, details of these steps will not be described or described in detail.

The processes as described with respect to FIGS. 5a-5h, FIGS. 6a-6h, FIGS. 7a-7f, FIGS. 8a-8j, FIGS. 9a-9f and FIGS. 10a-10f above result in similar or the same advantages as described with respect to FIGS. 1a-1b, 2a-2b and 3a-3b above. For example, the processes as described enable a memory cell having an access portion and an embedded programmable portion in a single transistor to be produced. This significantly reduces area requirements, leading to smaller device to be formed. Moreover, the use of a programmable resistive layer enables multi-time programmability. The embodiments as described also enable significant power reduction and speed improvement. In addition, the memory cell as described can be simultaneously formed with other devices, including but not limited to I/O and core devices, using CMOS processing. Thus, the processes are highly compatible and integratable with CMOS processing. Since the memory cell may be formed together with other CMOS devices using the same masks, manufacturing costs may further be reduced.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory device comprising:
   a substrate including a device region that comprises a channel region, the channel region including a first channel sub-region and a second channel sub-region; and
   a multi-time programmable (MTP) memory cell having a single transistor, wherein the single transistor includes:
   a gate structure including a transitional metal oxide layer disposed over the first channel sub-region and the second channel sub-region, a metal gate electrode disposed on the transitional metal oxide layer, and a buffer layer, wherein the metal gate electrode covers an entire top surface of the transitional metal oxide layer, the transitional metal oxide layer includes a first portion that overlaps the first channel sub-region, the transitional metal oxide layer includes a second portion that overlaps the second channel sub-region, the first portion of the transitional metal oxide layer directly contacts a top surface of the substrate, the buffer layer is disposed between the second portion of the transitional metal oxide layer and the second channel sub-region, the buffer layer directly contacts the top surface of the substrate, and the buffer layer includes titanium.

2. The memory device of claim 1 further comprising:
   an isolation region in the substrate, the isolation region arranged to partially underlap the second portion of the transitional metal oxide layer.

3. The memory device of claim 2 wherein the MTP memory cell includes a heavily doped region disposed adjacent to the first channel sub-region, and the second channel sub-region is disposed adjacent to the isolation region.

4. The memory device of claim 2 wherein a topmost surface of the second portion of the transitional metal oxide layer is higher than a topmost surface of the first portion of the transitional metal oxide layer relative to the channel region.

5. A method of forming a multi-time programmable (MTP) non-volatile memory cell, the method comprising:
   providing a substrate;
   forming a gate structure of a single transistor over a channel region in the substrate, the channel region including a first channel sub-region and a second channel sub-region, wherein forming the gate structure comprises forming a metal gate electrode over a transitional metal oxide layer, the metal gate electrode covers an entire top surface of the transitional metal oxide layer, a first portion of the transitional metal oxide layer overlaps the first channel sub-region, and a second portion of the transitional metal oxide layer overlaps the second channel sub-region,
   wherein the first portion of the transitional metal oxide layer directly contacts a top surface of the substrate, a buffer layer is disposed between the second portion of the transitional metal oxide layer and the second channel sub-region, the buffer layer directly contacts the top surface of the substrate, and the buffer layer includes titanium.

6. The method of claim 5 further comprising:
   forming an isolation region in the substrate,
   wherein the isolation region is arranged to partially underlap the second portion of the transitional metal oxide layer.

7. The method of claim 6 wherein a topmost surface of the second portion of the transitional metal oxide layer is higher than a topmost surface of the first portion of the transitional metal oxide layer relative to the channel region.

8. The method of claim 6 wherein the MTP memory cell includes a heavily doped region disposed adjacent to the first channel sub-region, and the second channel sub-region is disposed adjacent to the isolation region.

* * * * *